(12) United States Patent
Omori et al.

(10) Patent No.: US 11,747,365 B2
(45) Date of Patent: Sep. 5, 2023

(54) PROBE SUBSTRATE AND ELECTRICAL CONNECTING APPARATUS

(71) Applicants: KABUSHIKI KAISHA NIHON MICRONICS, Tokyo (JP); TANAKA KIKINZOKU KOGYO K.K., Tokyo (JP)

(72) Inventors: Toshinori Omori, Tokyo (JP); Kazuya Goto, Tokyo (JP); Yasuaki Osanai, Tokyo (JP); Takashi Akiniwa, Tokyo (JP); Takeki Sugisawa, Tokyo (JP); Takeshi Kondo, Kanagawa (JP); Shintaro Abe, The Cavendish (SG); Maki Watanabe, Kanagawa (JP)

(73) Assignees: KABUSHIKI KAISHA NIHON MICRONICS, Tokyo (JP); TANAKA KIKINZOKU KOGYO K.K., Tokyo (JP)

( * ) Notice: Subject to any disclaimer, the term of this patent is extended or adjusted under 35 U.S.C. 154(b) by 250 days.

(21) Appl. No.: 17/417,183

(22) PCT Filed: Oct. 18, 2019

(86) PCT No.: PCT/JP2019/041156
§ 371 (c)(1),
(2) Date: Dec. 9, 2021

(87) PCT Pub. No.: WO2020/148960
PCT Pub. Date: Jul. 23, 2020

(65) Prior Publication Data
US 2022/0099702 A1  Mar. 31, 2022

(30) Foreign Application Priority Data
Jan. 15, 2019 (JP) ................. 2019-004573

(51) Int. Cl.
*G01R 1/04* (2006.01)
*G01R 1/067* (2006.01)
(Continued)

(52) U.S. Cl.
CPC ........... *G01R 1/07342* (2013.01); *G01R 3/00* (2013.01); *G01R 31/2889* (2013.01); *H01L 22/12* (2013.01)

(58) Field of Classification Search
CPC .......... G01R 1/04; G01R 1/067; G01R 1/073; G01R 31/28; G01R 3/00; H01R 12/14; H01L 21/48; H01L 21/66
See application file for complete search history.

(56) References Cited

U.S. PATENT DOCUMENTS

| 5,083,697 A | 1/1992 | DiFrancesco |
| 5,286,417 A * | 2/1994 | Mahmoud .............. H05K 3/323 252/514 |

(Continued)

FOREIGN PATENT DOCUMENTS

| CN | 107710336 A | 2/2018 |
| EP | 05549159 A2 | 6/1993 |

(Continued)

OTHER PUBLICATIONS

First official action issued in corresponding Taiwan Patent Appln. No. 108138161 dated Jan. 19, 2021.
(Continued)

*Primary Examiner* — Neel D Shah
(74) *Attorney, Agent, or Firm* — BACON&THOMAS,PLLC

(57) ABSTRACT

An object is to enhance the durability of substrates of a probe substrate and/or the probe substrate and a member to be joined.
A probe substrate according to the present disclosure includes: a plurality of electrical contactors respectively
(Continued)

brought into electrical contact with a plurality of electrode terminals of a member to be inspected, a joint portion for a member to be joined is provided on one or each of a first surface and a second surface of the probe substrate and the member to be joined is joined to the joint portion with a metal layer that includes, in a metal component, at least 70 atomic percent or more of a transition metal and that is formed by sintering, and/or in a joining surface between a plurality of substrates of the probe substrate, the substrates are joined together with the metal layer formed by sintering, in the metal layer formed by sintering, a plurality of organic component parts and/or voids formed by heating an adhesive composition including a thermoplastic resin are left and the organic component parts and/or the voids included in the metal layer formed by sintering have 5 to 80 area percent in a vertical cross section of the metal layer formed by sintering.

19 Claims, 12 Drawing Sheets

(51) Int. Cl.

| | | |
|---|---|---|
| *G01R 1/073* | (2006.01) | |
| *G01R 31/28* | (2006.01) | |
| *G01R 3/00* | (2006.01) | |
| *H01L 21/48* | (2006.01) | |
| *H01L 21/66* | (2006.01) | |

(56) References Cited

U.S. PATENT DOCUMENTS

| | | |
|---|---|---|
| 2008/0139017 A1 | 6/2008 | Kiyofuji et al. |
| 2010/0134128 A1 | 6/2010 | Hobbs |
| 2017/0323842 A1 | 11/2017 | Tani et al. |
| 2017/0369746 A1 | 12/2017 | Mihara et al. |

FOREIGN PATENT DOCUMENTS

| | | |
|---|---|---|
| EP | 3333856 A1 | 6/2018 |
| JP | 2008-145238 A | 6/2008 |
| JP | 4155821 B2 | 9/2008 |
| JP | 2011-175871 A | 9/2011 |
| JP | 5-279649 A | 9/2013 |
| JP | 2015/092552 A | 5/2015 |
| JP | 2016-167527 A | 9/2016 |
| JP | 2016-172913 A | 9/2016 |
| JP | 2018-506496 A | 3/2018 |
| JP | 2018-78195 A | 5/2018 |
| TW | I284379 | 7/2007 |
| TW | 201124225 A1 | 7/2011 |
| TW | 201538264 A | 10/2015 |
| WO | WO91/12108 A1 | 8/1991 |
| WO | WO2006/126279 A1 | 11/2006 |
| WO | WO2010/065352 A2 | 6/2010 |
| WO | WO2017/022523 A1 | 2/2017 |
| WO | WO2017/115461 A1 | 7/2017 |

OTHER PUBLICATIONS

Second Office Action along with Machine English Translation dated Apr. 17, 2019 in Japanese Patent Appln. No. 2019-004573.
International Search Report cited in International Appln. No. PCT/JP2019/041156 dated Dec. 12, 2019.

* cited by examiner

| | METAL COMPONENT OF METAL LAYER | | AREA (%) OCCUPIED BY METAL COMPONENT BY VERTICAL CROSS SECTION OBSERVATION ON JOINING SURFACE OF JOINT PORTION | AREA (%) OCCUPIED BY ORGANIC COMPONENT PARTS AND/OR VOIDS BY VERTICAL CROSS SECTION OBSERVATION ON JOINING SURFACE OF JOINT PORTION | SEPARATION TEST BY COOLING/HEATING CYCLES (RATIO (%) OF SEPARATION AREA) |
|---|---|---|---|---|---|
| | CONSTITUENT METAL | TRANSITION METAL CONTENT | | | |
| EXAMPLE 1 | Ag | 100at% | 83 | 17 | 2 |
| EXAMPLE 2 | Ag | 100at% | 70 | 30 | 5 |
| EXAMPLE 3 | Ag | 100at% | 52 | 48 | 2 |
| EXAMPLE 4 | Ag | 100at% | 93 | 7 | 10 |
| EXAMPLE 5 | Ag, Cu | 100at% (Ag: 70at%, Cu30at%) | 80 | 20 | 5 |
| EXAMPLE 6 | Ag, Sn | 90at% (Ag) | 80 | 20 | 8 |
| COMPARATIVE EXAMPLE 1 | Ag, Sn | 65at% (Ag) | 75 | 25 | 50 |

FIG. 6

PROBE SUBSTRATE AND ELECTRICAL CONNECTING APPARATUS

CROSS-REFERENCE TO RELATED APPLICATIONS

The present application claims, under 35 USC 119, priority of Japanese Patent Application No. 2019-004573 filed on Jan. 15, 2019.

TECHNICAL FIELD

The present disclosure relates to probe substrates and electrical connecting apparatus, and can be applied to an electrical connecting apparatus that electrically connects between an inspection device and the electrode terminals of a member to be inspected, for example, when an electrical inspection or the like is performed on the member to be inspected formed on a semiconductor wafer.

BACKGROUND ART

In an electrical inspection on each semiconductor integrated circuit (member to be inspected) formed on a semiconductor wafer, an inspection device (tester) is used that includes a probe card having a plurality of probes (electrical contactors) in a test head.

In the inspection, the member to be inspected is placed on a chuck top, and the member to be inspected on the chuck top is pressed to the probe card attached to the inspection device. The probe card is fitted with a plurality of probes such that the tip portions of the probes protrude from the lower surface of the probe card, the member to be inspected is pressed to the probe card and thus the tip portions of the probes and the corresponding electrode terminals of the member to be inspected are brought into electrical contact with each other. Then, electrical signals from the inspection device are supplied through the probes to the member to be inspected, the signals from the member to be inspected are taken into the side of the tester through the probes and thus it is possible to perform the electrical inspection on the member to be inspected.

Patent Literature 1 discloses that in order to hold the horizontality of a probe card with respect to the electrode terminals of a member to be inspected and to hold the positions of the tips of a plurality of probes horizontal, an anchor is provided on a probe substrate, and a spacer member (support portion) is provided on the top of the anchor. Conventionally, when an anchor is provided on a probe substrate, the anchor is generally joined on the probe substrate with a solder material.

In Patent Literature 1, wiring is formed in the lower surface of the probe substrate, the probes are provided on a probe land that is connected to the wiring and when the probes are joined to the probe land, they are joined with a solder material.

CITATION LIST

Patent Literature

Patent Literature 1: International Publication No. WO2006/126279

SUMMARY OF INVENTION

Technical Problem

In recent years, for example, as the integration of semiconductor integrated circuits has been enhanced and pitches between electrodes have been narrowed, the number of probes fitted to a probe substrate has been increased, and thus when a member to be inspected is pressed to the probe substrate, a large reaction force acts on an electrical connecting apparatus. However, the durability of a solder material utilized as an anchor joint portion on a conventional probe substrate is not sufficient, and consequently, it is disadvantageously difficult to achieve secure joining.

Moreover, for example, as the functionality of a member to be inspected is enhanced, when an electrical inspection is performed on the member to be inspected that is used in an environment of large temperature changes, in an electrical connecting apparatus, it is required to perform the inspection in an environment of temperature changes corresponding to the usage environment of the member to be inspected. However, in particular, under a high temperature environment, a solder material serving as a joint portion is softened, and thus it is difficult to acquire sufficient durability, with the result that it is also disadvantageously difficult to acquire a sufficient life.

In a probe substrate formed with a plurality of substrates, it is also required to more enhance the joining of the substrates.

Hence, in view of the problems described above, an object is to provide a probe substrate and an electrical connecting apparatus that enhance the durability of a member to be joined provided between the substrates of the probe substrate and/or on one or each of the upper surface (first surface) and the lower surface (second surface) of the probe substrate so as to be able to prolong the life thereof.

Solution to Problem

In order to solve the problems described above, a probe substrate according to a first present disclosure is provided, the probe substrate includes: a plurality of electrical contactors respectively brought into electrical contact with a plurality of electrode terminals of a member to be inspected, a joint portion for a member to be joined is provided on one or each of a first surface and a second surface of the probe substrate and the member to be joined is joined to the joint portion with a metal layer that includes, in a metal component, at least 70 atomic percent or more of a transition metal and that is formed by sintering, and/or in a joining surface between a plurality of substrates of the probe substrate, the substrates are joined together with the metal layer formed by sintering, in the metal layer formed by sintering, a plurality of organic component parts and/or voids formed by heating an adhesive composition including a thermoplastic resin are left and the organic component parts and/or the voids included in the metal layer formed by sintering have 5 to 80 area percent in a vertical cross section of the metal layer formed by sintering.

An electrical connecting apparatus according to a second present disclosure is provided, the electrical connecting apparatus electrically connects an inspection device and a plurality of electrode terminals of a member to be inspected and the electrical connecting apparatus includes: a wiring substrate including a wiring circuit connected to the inspection device; the probe substrate of the first present disclosure; and a connection unit connecting the wiring circuit of the wiring substrate and a plurality of the electrical contactors of the probe substrate respectively.

Advantageous Effects of Invention

According to the present disclosure, it is possible to enhance the durability of a member to be joined provided between the substrates of a probe substrate and/or on one or each of the upper surface (first surface) and the lower surface (second surface) of the probe substrate so as to prolong the life thereof.

BRIEF DESCRIPTION OF DRAWINGS

FIG. 6 is evaluation results obtained by evaluating the properties of joint parts joined with the adhesive composition of the embodiment;

DESCRIPTION OF EMBODIMENTS (A) Main Embodiment

An embodiment of a probe substrate and an electrical connecting apparatus according to the present disclosure will be described in detail below with reference to drawings.

(A-1) Electrical Connecting Apparatus

Figure 1:
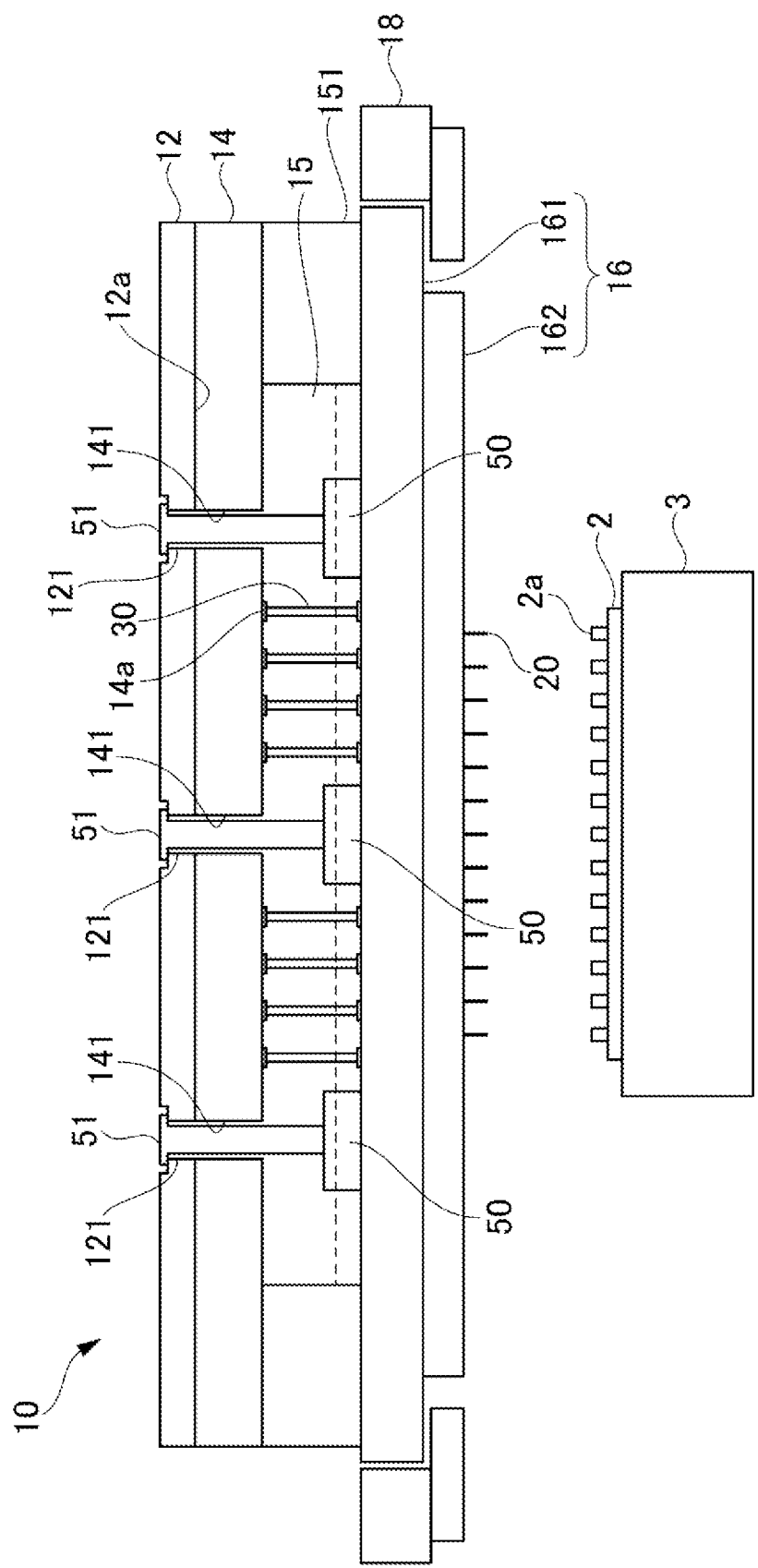
FIG. 1 is a configuration diagram showing the configuration of an electrical connecting apparatus according to an embodiment.

FIG. 1 is a configuration diagram showing the configuration of the electrical connecting apparatus according to this embodiment.

Although the electrical connecting apparatus 10 of FIG. 1 illustrates main component members, there is no limitation to these component members, and component members that are not shown in FIG. 1 are actually included. In the following description, based on an up/down direction in FIG. 1, an "upward direction" and a "downward direction" will be mentioned.

In FIG. 1, the electrical connecting apparatus 10 according to this embodiment includes: a flat plate-shaped support member 12; a flat plate-shaped wiring substrate 14 that is held on the lower surface 12*a* of the support member 12; an electrical connection unit 15 that is electrically connected to the wiring substrate 14; and a probe substrate 16 that is electrically connected to the electrical connection unit 15 and that includes a plurality of electrical contactors (hereinafter also referred to as "probes") 20.

Although in the electrical connecting apparatus 10, a large number of fixing members (for example, screw members such as a bolt) are used when the support member 12, the wiring substrate 14, the electrical connection unit 15 and the probe substrate 16 are assembled, these fixing members are not shown in FIG. 1.

In the electrical connecting apparatus 10, for example, a semiconductor integrated circuit or the like formed on a semiconductor wafer is used as a member to be inspected 2, and thus an electrical inspection is performed on the member to be inspected 2. Specifically, the member to be inspected 2 is pressed toward the probe substrate 16, the tip portions of the probes 20 of the probe substrate 16 and the electrode terminals 2*a* of the member to be inspected 2 are brought into electrical contact with each other, electrical signals are supplied from an unillustrated tester (inspection device) to the electrode terminals 2*a* of the member to be inspected 2, the electrical signals from the electrode terminals 2*a* of the member to be inspected 2 are further provided to the side of the tester and thus the electrical inspection is performed on the member to be inspected 2. The electrical connecting apparatus 10 is also referred to as, for example, a probe card.

The member to be inspected 2, which is an inspection target, is placed on the upper surface of a chuck top 3. In the chuck top 3, position adjustments can be made in an X-axis direction that is a horizontal direction, a Y-axis direction that is perpendicular to the X-axis direction on a horizontal plane and a Z-axis direction that is perpendicular to the horizontal plane (X-Y plane), and its rotation posture can be further adjusted in the direction of e around the Z axis. When the electrical inspection is performed on the member to be inspected 2, a chuck that can be raised and lowered in the up/down direction (Z-axis direction) is moved, and thus in order to bring the electrode terminals 2*a* of the member to be inspected 2 into electrical contact with the tip portions of the probes 20 of the probe substrate 16, the lower surface of the probe substrate 16 in the electrical connecting apparatus 10 and the member to be inspected 2 on the upper surface of the chuck top 3 are moved relatively close to each other.

[Support Member]

The support member 12 is used for suppressing the deformation (for example, a deflection) of the wiring substrate 14. For example, since the probe substrate 16 includes a large number of probes 20, the weight of the probe substrate 16 attached to the side of the wiring substrate 14 is increased. When the electrical inspection is performed on the member to be inspected 2, the probe substrate 16 is pressed to the member to be inspected 2 on the chuck top 3, and thus the tip portions of the probes 20 protruding from the lower surface of the probe substrate 16 and the electrode terminals 2*a* of the member to be inspected 2 are brought into contact with each other. As described above, in the electrical inspection, an upwardly exerted reaction force (contact load) acts upward from below, and thus a large load is applied to the wiring substrate 14. The support member 12 functions as a member for suppressing the deformation (for example, a deflection) of the wiring substrate 14. In the support member 12, a plurality of through holes 121 which penetrate the upper surface and the lower surface thereof are provided. A plurality of the through holes 121 are respectively provided in positions corresponding to the positions of a plurality of anchors 50, which will be described later, arranged on the upper surface of the probe substrate 16 and are also respectively provided in positions corresponding to the positions of a plurality of through holes 141 provided in the wiring substrate 14. In each of the through holes 121 of the support member 12, a spacer (hereinafter also referred to as a "support portion") 51 is inserted downward from above the support member 12, and thus the lower end portion of the spacer (support portion) 51 can be fixed to the corresponding anchor 50. For example, the lower end portion of the spacer (support portion) 51 is a male screw portion, a substantially center portion of the anchor 50 arranged on the upper surface of the probe substrate 16 is a female screw portion 501, the lower end portion (male screw portion) of the spacer (support portion) 51 is screwed to the female screw portion of the anchor 50 and thus they can be fixed together. In this way, a distance between the upper surface of the probe substrate 16 and the upper surface of the support member 12 can be held to be a predetermined distance length.

[Wiring Substrate]

The wiring substrate 14 is formed of, for example, a resin material such as a polyimide, and is, for example, a printed substrate that is formed substantially in the shape of a circular plate. On a peripheral portion of the upper surface of the wiring substrate 14, a large number of electrode terminals (not shown) for electrically connecting to the test head (not shown) of the tester (inspection device) are arranged. On the lower surface of the wiring substrate 14, a wiring pattern is formed, and the connection terminals 14a of the wiring pattern are electrically connected to the upper end portions of connectors 30 such as pogo pins provided in the electrical connection unit 15.

Furthermore, within the wiring substrate 14, a wiring circuit (not shown) is formed, and the wiring pattern on the lower surface of the wiring substrate 14 and the electrode terminals on the upper surface of the wiring substrate 14 can be connected through the wiring circuit within the wiring substrate 14. Hence, through the wiring circuit within the wiring substrate 14, electrical signals can be passed between the connectors 30 of the electrical connection unit 15 electrically connected to the connection terminals 14a of the wiring pattern on the lower surface of the wiring substrate 14 and the test head connected to the electrode terminals on the upper surface of the wiring substrate 14. On the upper surface of the wiring substrate 14, a plurality of electronic components necessary for the electrical inspection of the member to be inspected 2 are also arranged.

In the wiring substrate 14, the through holes 141 that penetrate the upper surface and the lower surface of the wiring substrate 14 are provided. A plurality of the through holes 141 are respectively arranged in positions corresponding to the positions of a plurality of the anchors 50 arranged on the upper surface of the probe substrate 16, and are also respectively arranged in positions corresponding to the positions of a plurality of the through holes 121 of the support member 12.

The shape of the opening of each of the through holes 141 can be set to a shape corresponding to the shape of the support portion 51 inserted therethrough. The inside diameter of each of the through holes 141 is substantially equal to or slightly larger than the outside diameter of the support portion 51 so that the support portion 51 can be inserted through the through hole 141.

Although in this embodiment, in order to illustrate a case where the support portion 51 is a cylindrical member, a case where the shape of the opening of the through hole 141 is substantially circular is illustrated, there is no limitation to this configuration. For example, a member of a right prism in which the cross-sectional shape of the support portion 51 is substantially square, a member of a polygonal prism in which the cross-sectional shape thereof is polygonal or the like may be adopted, and even in such a case, the shape of the opening of the through hole 141 can be set to such a shape that the support portion 51 can be inserted therethrough.

[Electrical Connection Unit]

The electrical connection unit 15 includes a plurality of the connectors 30 such as pogo pins. In a state where the electrical connecting apparatus 10 is assembled, the upper end portions of the connectors 30 are electrically connected to the connection terminals 14a of the wiring pattern on the lower surface of the wiring substrate 14, and the lower end portions of the connectors 30 are connected to a pad provided on the upper surface of the probe substrate 16. The tip portions of the probes 20 are brought into electrical contact with the electrode terminals of the member to be inspected 2, and thus the electrode terminals of the member to be inspected 2 are electrically connected through the probes 20 and the connectors 30 to the tester (inspection device), with the result that the electrical inspection can be performed on the member to be inspected 2 with the tester (inspection device).

For example, the electrical connection unit 15 includes a plurality of through holes so that the connectors 30 are inserted therethrough, and the connectors 30 are inserted through the through holes such that the upper end portions and the lower end portions of the connectors 30 protrude. A mechanism for fitting the connectors 30 in the electrical connection unit 15 is not limited to the configuration in which the through holes are provided, and various configurations can be widely applied. A flange portion 151 is provided around the electrical connection unit 15.

[Probe Substrate]

The probe substrate 16 is a substrate that includes the probes 20, and is formed substantially in the shape of a circle or a polygon (for example, a hexadecagon). Although a case where the probe 20 is, for example, a cantilever-type probe (electrical contactor) is illustrated, there is no limitation to this configuration. The probe substrate 16 includes a substrate member 161 formed with, for example, a ceramic plate and a multilayer wiring substrate 162 formed on the lower surface of the substrate member 161.

Within the substrate member 161, which is a ceramic substrate, a large number of conductive paths (not shown) that penetrate in the direction of the thickness of the plate are formed, the pad is formed on the upper surface of the substrate member 161 and one ends of the conductive paths within the substrate member 161 are formed to connect to the corresponding connection terminals of the wiring pattern on the upper surface of the substrate member 161. Furthermore, on the lower surface of the substrate member 161, the other ends of the conductive paths within the substrate member 161 are formed to connect to connection terminals provided on the upper surface of the multilayer wiring substrate 162.

The multilayer wiring substrate 162 is formed with a plurality of multilayer substrates that are formed of, for example, a synthetic resin material such as a polyimide, and wiring paths (not shown) are formed between the multilayer substrates. One ends of the wiring paths of the multilayer wiring substrate 162 are connected to the other ends of the conductive paths on the side of the substrate member 161, which is a ceramic substrate, and the other ends of the multilayer wiring substrate 162 are connected to a probe land 163 (see FIG. 12) provided on the lower surface of the multilayer wiring substrate 162. A plurality of the probes 20 are arranged on the probe land 163 provided on the lower surface of the multilayer wiring substrate 162, and a plurality of the probes 20 of the probe substrate 16 are electrically connected through the electrical connection unit 15 to the corresponding connection terminals 14a of the wiring substrate 14.

(A-2) Joining of Member to be Joined

The joining of a member to be joined to one or each of the upper surface (first surface) and the lower surface (second surface) of the probe substrate 16 will then be described with reference to drawings.

In the following description, the member to be joined is the anchor 50, and a case where the anchors 50 are joined to the upper surface (that is, the upper surface of the substrate member 161) of the probe substrate 16 will be illustrated.

In order for the probes 20 of the electrical connecting apparatus 10 to be reliably brought into contact with each of the electrode terminals 2a of the member to be inspected 2, the positions of heights of the tips of the probes 20 fitted to the probe substrate 16 are held horizontal, and, in a state where the positions of heights of the tips of the probes 20 are aligned, the tips of the probes 20 are required to be pressed to and brought into contact with the electrode terminals 2a of the member to be inspected 2.

However, in recent years, for example, as the integration of a semiconductor integrated circuit serving as the member to be inspected 2 has been enhanced and pitches between electrodes have been narrowed, the number of probes 20 fitted to the probe substrate 16 has been increased, and when the member to be inspected 2 is pressed to the probe substrate 16, a large reaction force (that is, a high load) acts on the electrical connecting apparatus 10, and thus a deformation such as a deflection can occur in the probe substrate 16 or the like, with the result that it is difficult to hold the positions of heights of the probes horizontal.

In order to suppress the deflection as described above, a plurality of the anchors 50 are provided on the upper surface of the probe substrate 16, the lower end portions of the support portion 51 are made to abut against the upper surfaces of the anchors 50 so as to be fixed thereto and thus the probe substrate 16 and the support member 12 can be bonded to each other.

Incidentally, conventionally, a solder material is generally used to join the anchors 50 to the upper surface of the probe substrate 16. However, since as described above, for example, the number of probes 20 is increased and a high contact load is applied, the durability of the solder material is not sufficient, with the result that it is disadvantageously difficult to hold the parallelism of an imaginary plane formed with the tip portions of a plurality of the probes 20 arranged on the lower surface of the probe substrate 16 and a plane formed with the electrode terminals 2a on the semiconductor wafer.

Moreover, for example, as the functionality of the member to be inspected 2 is enhanced, when the electrical inspection is performed on the member to be inspected 2 that is used in an environment of large temperature changes, in the electrical connecting apparatus 10, it is required to perform the electrical inspection on the member to be inspected 2 in the environment of temperature changes corresponding to the usage environment of the member to be inspected 2.

However, when the electrical inspection is performed on the member to be inspected 2 in an environment of large temperature changes, in particular, when the electrical inspection is performed on the member to be inspected 2 in a high temperature environment, for example, the solder material is softened, and thus the solder material is deformed, with the result that it is also disadvantageously difficult to sufficiently hold the durability of the solder material joining the probe substrate 16 and the anchors 50.

Hence, in this embodiment, through metal layers 60 having properties as will be described later, the anchors 50 are joined to the positions of the probe substrate 16 in which the anchors 50 are arranged. In this way, it is possible to enhance the durability and the life thereof.

[Arrangement of Anchors 50]

Figure 2:
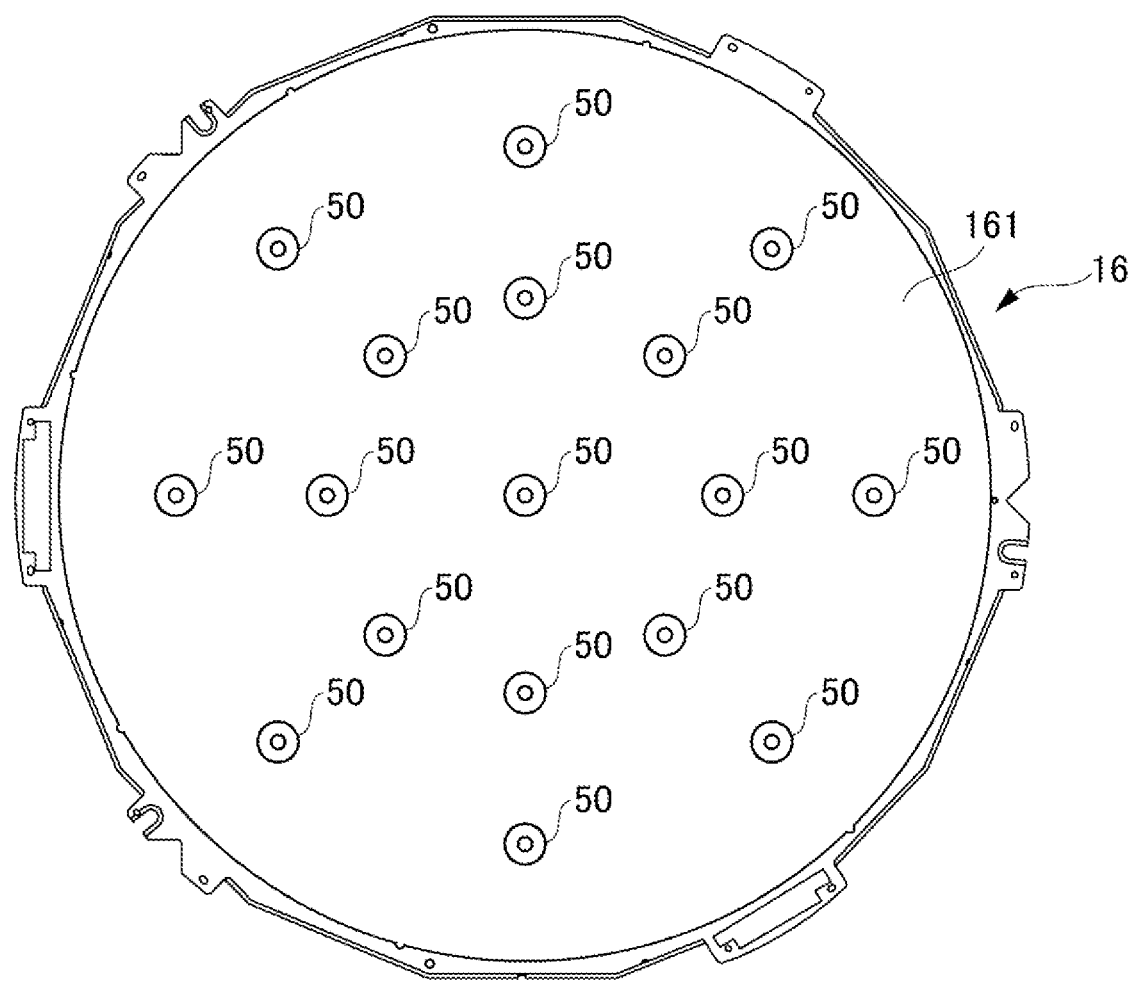
FIG. 2 is an arrangement configuration diagram showing the arrangement of a plurality of anchors provided on the upper surface of a probe substrate according to the embodiment.

FIG. 2 is an arrangement configuration diagram showing the arrangement of the anchors 50 provided on the upper surface of the probe substrate 16 according to the embodiment.

As shown in FIG. 2, on the upper surface of the probe substrate 16, the anchors 50 are arranged. FIG. 2 illustrates a case where a total of 17 anchors 50 consisting of one anchor 50 provided in the center position of a center portion of the probe substrate 16, eight anchors 50 provided at regular angle intervals on a first imaginary circle with its center position being a center and eight anchors 50 provided at regular angle intervals on a second imaginary circle whose diameter is larger than that of the first imaginary circle are provided. Although FIG. 2 illustrates the case where 17 anchors 50 are arranged, the number of anchors 50 is not limited.

Figure 3:
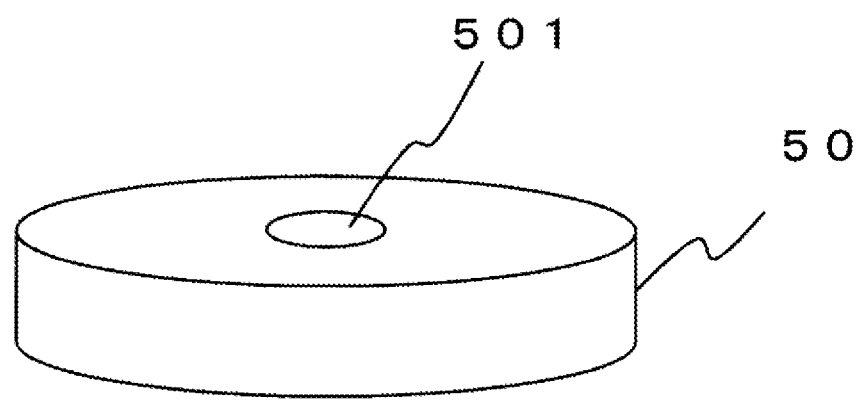
FIG. 3 is a configuration diagram showing the configuration of an anchor portion in the embodiment.

In the anchor 50, a member formed with a cylindrical metal member can be used as illustrated in FIG. 3, and the female screw portion 501 is provided in its center portion. For example, the lower end portions (male screw portions) of the spacers (support portions) 51 inserted downward from above the through holes 121 of the support member 12 are screwed to the female screw portions 501 of the corresponding anchors 50 so as to be fixed thereto, and thus the support member 12 and the probe substrate 16 are fixed together.

Figure 4:
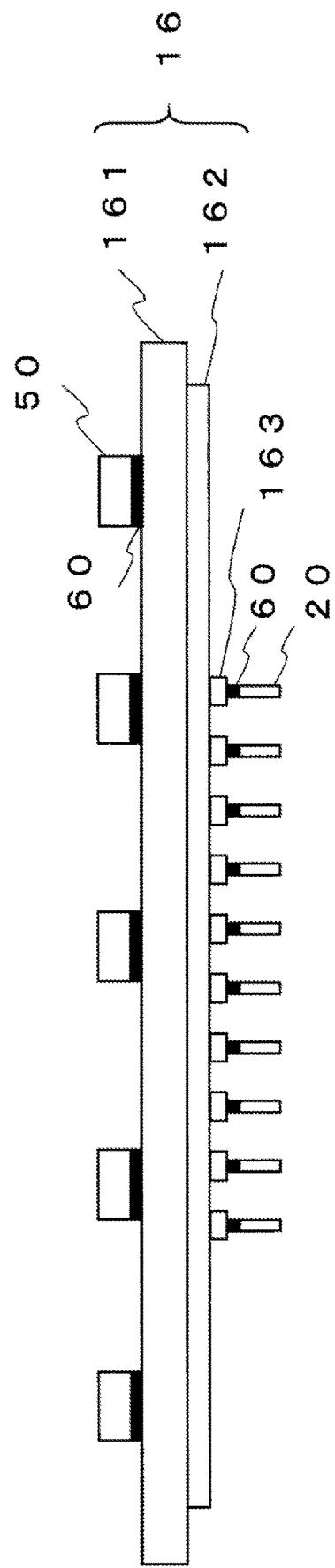
FIG. 4 is a diagram showing the joining structure of the anchors provided on the upper surface of the probe substrate according to the embodiment.

FIG. 4 is a diagram showing the joining structure of the anchors 50 provided on the upper surface of the probe substrate 16 according to the embodiment.

As shown in FIG. 4, on the upper surface of the probe substrate 16, an adhesive composition having properties that will be described later is applied to the positions in which the anchors 50 are arranged, the anchors 50 are provided thereon, heat is applied to form the metal layers 60 in which the adhesive composition is cured and thus the anchors 50 are joined to the upper surface of the probe substrate 16.

(A-2-1) Metal Layer

The metal layer 60 of the present disclosure is formed by using, for example, the adhesive composition containing metal fine particles (metal filler) and particles of a thermoplastic resin and performing burning or the like. The metal layer 60 includes a metal component, and the metal component is formed of at least 70 atomic percent or more of a transition metal. The metal component refers to a component formed of only one or more transition metals or a component formed of one or more transition metals and one or more main group metals. As the transition metal, the transition metals of the 4th to 6th periods of the 8th to 11th groups are preferably used, the transition metals of the 4th to 6th periods of the 10th and 11th groups are more preferably used, silver, copper and gold of the 11th group are further preferably used and silver and copper are optimally used. When two or more transition metals are used, 70 atomic percent or more of silver is preferably included with respect to the total amount of the transition metals. A content of the transition metal in the metal component included in the metal layer 60 is preferably equal to or greater than 70 atomic percent, more preferably equal to or greater than 80 atomic percent and optimally equal to or greater than 90 atomic percent. The upper limit thereof may be 100 atomic percent. When the main group metal is included in the metal component, as the main group metal, the main group metals of the 12th to 16th groups are preferably used, the main group metals of the 12th to 14th groups are more preferably used, zinc, aluminum, indium, germanium, tin and bismuth are further preferably used and zinc, aluminum and tin are optimally used. A content of the main group metal in the metal component included in the metal layer 60 is preferably less than 30 atomic percent, more preferably less than 20 atomic percent and optimally less than 10 atomic percent. The lower limit thereof may be 0 atomic percent. Here, the content (atomic percent) refers to a relative number of atoms (or a relative number of moles) of a specific metal component (all transition metals or all main group metals) when the number of atoms (or the number of moles) of all metals in the metal component is assumed to be 100. The content is calculated, for example, by measuring the amount of each metal component contained by ICP analysis.

The metal layer 60 of the present disclosure preferably includes a plurality of organic component parts and/or voids. The organic component part is a part formed of an organic component, is preferably formed of an organic resin component and more preferably contains a thermoplastic resin. Examples of the thermoplastic resin used include polyethylene, polypropylene, AS resin, ABS resin, AES resin, vinyl acetate resin, polystyrene, polyvinyl chloride, acrylic resin, methacrylic resin, polyvinyl alcohol resin, polyvinyl ether, polyacetal, polycarbonate, polyethylene terephthalate, polybutylene terephthalate, polyvinyl butyral, polyvinyl formal, polysulfone, polyethersulfone, polyimide, phenoxy resin polyetherimide, ethyl cellulose, cellulose acetate, various types of fluororesins, polyolefin elastomer, silicone resin, known polyamide resins such as nylon 11, nylon 12 and nylon 6 and the like. The void is a hollow part that does not include a metal component and an organic component.

The organic component parts and/or the voids can more enhance the action of relieving stress caused by repeated temperature changes. Hence, in a vertical cross section of the metal layer 60 of the present disclosure, as a lower limit value, the organic component parts and/or the voids preferably occupy 5 area percent or more, more preferably occupy 10 area percent or more and further preferably occupy 15 area percent or more. In the vertical cross section of the metal layer 60 of the present disclosure, as an upper limit value, the organic component parts and/or the voids preferably occupy 80 area percent or less, more preferably occupy 60 area percent or less and further preferably occupy 50 area percent or less. In the vertical cross section of the metal layer 60 of the present disclosure, for example, the organic component parts and/or the voids preferably occupy 5 to 80 area percent, more preferably occupy 10 to 60 area percent and further preferably occupy 15 to 50 area percent. In the calculation of the area described above, for example, an image analysis, a mapping analysis or the like using a SEM or a TEM is performed on any areas of the vertical cross section, for each of the areas, a ratio of the area of all the organic component parts and/or the voids to the area of the entire measurement range is calculated and the area described above is calculated from the average value thereof.

When in the vertical cross section of the metal layer 60, the area (all the area of the metal layer) of the metal component and the organic component parts and/or the voids is assumed to be 100 area percent, the metal component included in the metal layer 60 of the present disclosure preferably occupies 20 to 95 area percent, more preferably occupies 40 to 90 area percent and further preferably occupies 50 to 85 area percent. In the calculation of the area described above, for example, an image analysis, a mapping analysis or the like using a SEM or a TEM is performed on any areas of the vertical cross section, for each of the areas, a ratio of the area of all the metal component to the area of the entire measurement range is calculated and the area described above is calculated from the average value thereof.

[Metal Fine Particles]

The metal fine particles in the adhesive composition are fine particles of an alloy including a transition metal, mixed particles of fine particles of a transition metal and metal fine particles other than the transition metal or composite particles of these two or more types. As the transition metal, all general transition metals can be utilized, and examples of the transition metal utilized include a single transition metal, an alloy formed of two or more types of transition metals, a metal oxide, a compound of a transition metal and the like. As the transition metal species, the transition metals of the 4th to 6th periods of the 8th to 11th groups are preferably used, the transition metals of the 4th to 6th periods of the 10th and 11th groups are more preferably used, silver, copper and gold of the 11th group are further preferably used and silver and copper are optimally used. When two or more types of transition metals are used, 70 atomic percent or more of silver is preferably included with respect to the total amount of the transition metals. A content of the transition metal in the metal fine particles is preferably equal to or greater than 70 atomic percent, more preferably equal to or greater than 80 atomic percent and optimally equal to or greater than 90 atomic percent. The upper limit thereof may be 100 atomic percent. Here, the content (atomic percent) of the transition metal refers to a relative number of atoms (or a relative number of moles) of all the transition metal component when the total number of atoms (or the total number of moles) of all the metal component in the metal fine particles is assumed to be 100. The content is calculated, for example, by measuring the amount of each metal component contained by ICP analysis. The metal component refers to a component formed of only one or more transition metals or a component formed of one or more transition metals and one or more main group metals. The transition metal included in the adhesive composition is not limited to the form in which the transition metal is included as a pure metal, and the transition metal may be included as an alloy of another metal component.

The shape of the metal fine particles in the adhesive composition is not particularly limited, and although examples thereof include a spherical shape, a flake shape, a plate shape, a foil shape, a dendritic shape and the like, the flake shape or the spherical shape is generally selected. As the metal fine particles in the adhesive composition, particles formed of a single metal, metal particles which are formed of two or more types of metals and whose surfaces are coated, or a mixture thereof can be used.

The average particle diameter (d50) of the metal fine particles in the adhesive composition is preferably 1 to 20

μm, more preferably 2 to 10 μm and further preferably 3 to 8 μm. When the average particle diameter (d50) is less than 1 μm, metal contraction after the adhesive composition is cured is prevented from being suppressed, and thus adhesion to a material to be adhered is lowered. When the average particle diameter (d50) exceeds 20 μm, the sintering of the metal fine particles is unlikely to proceed at the time of curing of the adhesive composition, and thus the adhesion to the material to be adhered is lowered. Even in a case where the metal fine particles include nanoparticles or submicron particles, when the average particle diameter (d50) of the entire metal fine particles is in a range of 1 to 20 μm, the metal fine particles satisfactorily function as the adhesive composition. The average particle diameter is calculated as the 50% average particle diameter (D50) of a particle diameter distribution measured with a laser diffraction/scattering particle size analyzer. The average particle diameter can be measured with, for example, a laser diffraction/scattering particle size analyzer MT-3000 made by Nikkiso Co., Ltd.

The surfaces of the metal fine particles in the adhesive composition may be coated with a coating agent. As the coating agent, for example, a coating agent including a carboxylic acid is mentioned.

In the adhesive composition, the amount of metal fine particles contained with respect to the entire amount of adhesive composition is preferably 40 to 95% by mass, more preferably 50 to 95% by mass and further preferably 60 to 90% by mass, and 70 to 90% by mass of the adhesive composition is optimally used.

[Particles of Thermoplastic Resin]

The particles of the thermoplastic resin in the adhesive composition are preferably the particles of the thermoplastic resin in a solid state at 25° C. (hereinafter also simply referred to as the "particles of the thermoplastic resin").

Although a solder material is conventionally used as a joining material for joining the anchors 50, the solder material has a closely packed structure so as to have low stress relaxation performance. The metal receives repeated temperature changes to grow, and thus the stress relaxation performance is further lowered. Hence, in the joining using the solder material, the separation of the member to be joined and the solder material and the breakage of the solder material are more likely to occur due to stress caused by a difference of linear thermal expansion coefficients of the members to be joined (for example, the anchors 50 and the probe substrate 16).

However, in the adhesive composition used in the metal layer 60 of this embodiment, for example, when heat is applied by burning or the like to cure the adhesive composition, parts or the whole of the particles of the thermoplastic resin are melted, and thus a plurality of voids are formed within the cured adhesive. Alternatively, parts or the whole of the particles of the thermoplastic resin are not melted to be left, the parts that are not melted to be left form, as a plurality of organic component parts, parts excluding the metal component and the parts that are melted form a plurality of voids.

Figure 5:
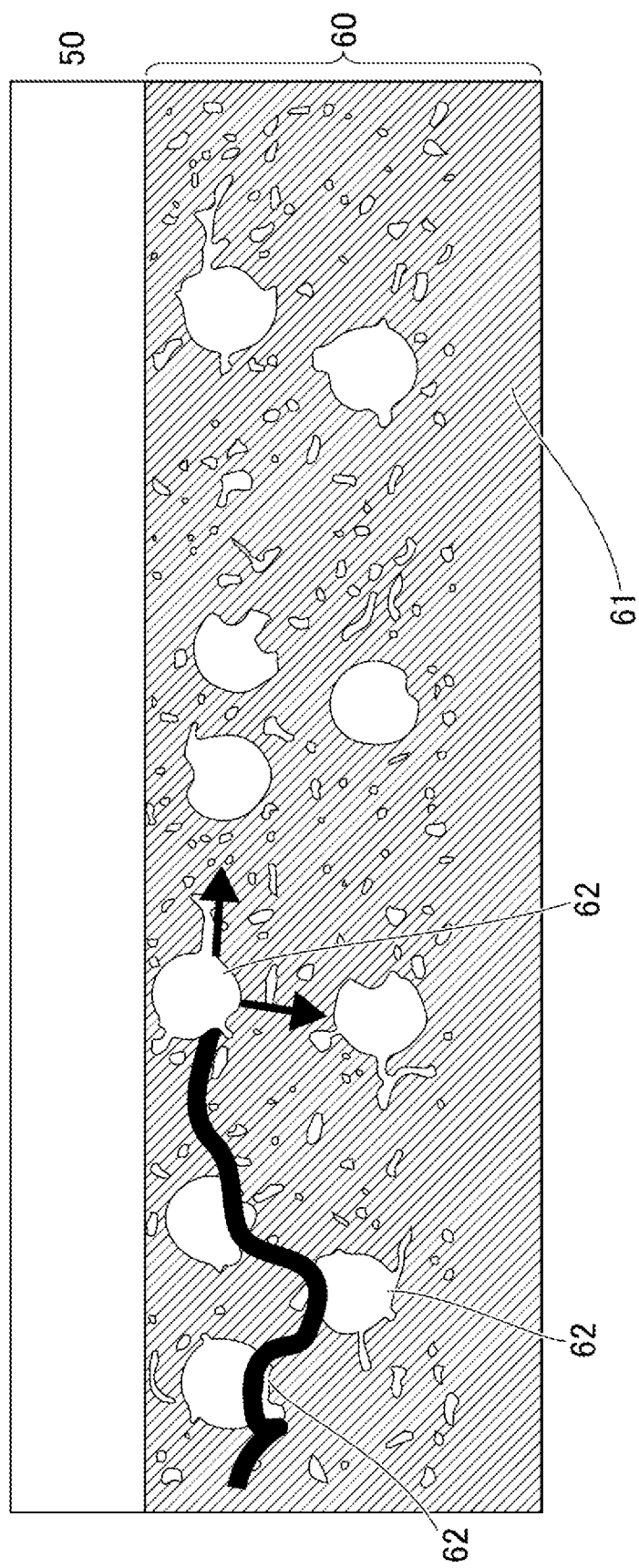
FIG. 5 is an illustrative diagram illustrating the cross-sectional structure of a metal layer (cured adhesive) of the embodiment.

FIG. 5 is an illustrative diagram illustrating the cross-sectional structure of the metal layer (cured adhesive) 60 of this embodiment.

As shown in FIG. 5, in a vertical cross section of the metal layer (cured adhesive) 60, the metal 61 and the parts 62 of the voids or the organic component parts in the particles of the thermoplastic resin are formed, and thus stress caused within the metal layer 60 is dispersed. Hence, it can be considered that the movement of the metal within the metal layer 60 is prevented and that thus as described above, the separation of the member to be joined (such as the anchors 50 or the probe substrate 16) and the metal layer (cured adhesive) 60 and a breakage within the metal layer (cured adhesive) 60 resulting from the stress caused by the difference of the linear thermal expansion coefficients are prevented from easily occurring. As described above, it can be considered that the phenomenon described above contributes to the suppression of the separation of the member to be joined and the metal layer 60 and the breakage of the metal layer 60 caused by repeated temperature changes.

As the particles of the thermoplastic resin in this embodiment, the particles of a known resin may be used, examples thereof include polyethylene, polypropylene, AS resin, ABS resin, AES resin, vinyl acetate resin, polystyrene, polyvinyl chloride, acrylic resin, methacrylic resin, polyvinyl alcohol resin, polyvinyl ether, polyacetal, polycarbonate, polyethylene terephthalate, polybutylene terephthalate, polyvinyl butyral, polyvinyl formal, polysulfone, polyethersulfone, polyimide, phenoxy resin polyetherimide, ethyl cellulose, cellulose acetate, various types of fluororesins, polyolefin elastomer, silicone resin, known polyamide resins such as nylon 11, nylon 12 and nylon 6 and the like and a mixture thereof may be used.

In order to obtain the effect of suppressing the separation and the breakage described above, it is necessary to melt the particles of the thermoplastic resin at the time of curing of the adhesive composition and to fill the voids within the cured adhesive. An appropriate heating temperature at the time of curing of the adhesive composition is normally 130 to 250° C. though the appropriate heating temperature is changed depending on, for example, various conditions such as the type of metal filler (metal fine particles). Hence, in this embodiment, the melting point of the particles of the thermoplastic resin is set equal to or less than 250° C. such that the particles of a thermosetting resin are sufficiently melted at the time of curing of the adhesive composition. The melting point of the particles of the thermoplastic resin is preferably equal to or less than 230° C. and more preferably equal to or less than 200° C.

On the other hand, when the particles of the thermoplastic resin are melted at the time of curing of the adhesive composition before the metal filler is sintered, the sintering of the metal filler is likely to be prevented. The sintering temperature of the metal filler is normally equal to or less than 130° C. although the sintering temperature is different depending on the type thereof or the like. Hence, in this embodiment, the melting point of the particles of the thermoplastic resin is set equal to or greater than 130° C. such that the particles of the thermoplastic resin are not melted before the metal filler is sintered. The melting point of the particles of the thermoplastic resin is preferably equal to or greater than 150° C. and more preferably equal to or greater than 160° C.

In order to obtain the effect of suppressing the separation and the breakage described above, the average particle diameter of the particles of the thermoplastic resin is also important. When the average particle diameter is large, the number of particles in the same amount is decreased, and thus the effect of dispersing the stress is reduced. A part can be produced in which the existence ratio of the resin particles with respect to the direction of the thickness of the adhesive is very high. This can cause a vulnerable point within the metal layer. Furthermore, when the average particle diameter of the particles of the thermoplastic resin is large, the thickness of the metal layer (cured adhesive) 60 cannot be reduced, and thus heat generated from a member to be adhered such as a semiconductor element cannot be efficiently released. From this point of view, it is not preferable that the average particle diameter of the particles of the thermoplastic resin is excessively large. For the reason described above, the particle diameter of the particles of the thermoplastic resin is set equal to or less than 12 μm. The average particle diameter of the particles of the thermoplastic resin is preferably equal to or less than 11 μm and more preferably equal to or less than 10 μm.

When the average particle diameter is small, the stress relaxation performance and the effect of suppressing the development of a crack are reduced. Hence, for the reason described above, the average particle diameter of the particles of the thermoplastic resin is set equal to or greater than 1 μm. The average particle diameter of the particles of the thermoplastic resin is preferably equal to or greater than 2 μm and more preferably equal to or greater than 3 μm.

The shape of the particles of the thermoplastic resin in the adhesive composition is not particularly limited, and although examples thereof include a substantially spherical shape, a cubic shape, a columnar shape, a prismatic shape, a conical shape, a pyramidal shape, a flake shape, a foil shape, a dendritic shape and the like, the substantially spherical shape and the cubic shape are preferable.

In order to highly prevent the separation of the member to be joined and the metal layer (cured adhesive) 60 and the breakage of the metal layer (cured adhesive) 60 when repeated temperature changes are received in the adhesive composition, the amount of particles of the thermoplastic resin contained with respect to the entire amount of adhesive composition is preferably equal to or greater than 0.5% by mass, more preferably equal to or greater than 1% by mass and further preferably equal to or greater than 2% by mass.

Since the particles of the thermoplastic resin are excessively contained, and thus the strength of the voids of the metal layer tend to be reduced, the joining strength of the member to be joined and the joint portion is lowered and the strength of the joint portion itself is lowered, the amount of particles of the thermoplastic resin contained is preferably equal to or less than 5% by mass, more preferably equal to or less than 4% by mass and further preferably equal to or less than 3% by mass.

[Other Components]

<Binder Resin>

In the adhesive composition, the metal fine particles and the particles of the thermoplastic resin may be dispersed in a binder resin. Although the binder resin is not particularly limited, for example, an epoxy resin, a phenol resin, a urethane resin, an acrylic resin, a silicone resin, a polyimide resin or the like can be used, and they may be used singly or a plurality of types of resins may be combined to be used. In terms of workability, the binder resin of this embodiment is preferably a thermosetting resin and particularly preferably an epoxy resin.

The amount of binder resin contained with respect to the entire amount of adhesive composition is preferably equal to or less than 5% by mass, more preferably equal to or less than 4% by mass and further preferably equal to or less than 2% by mass. When the amount of binder resin contained is equal to or less than 5% by mass, a metal network by necking of the metal fine particles (metal filler) is easily formed, and thus satisfactory separation and the effect of suppressing the breakage are obtained. When the binder resin is contained, 0.5% or more by mass of the binder resin is preferably used.

<Hardener>

The adhesive composition may contain, in addition to the components described above, for example, a hardener. Examples of the hardener include amine-based hardeners of tertiary amine, alkyl urea and imidazole and the like, phenol-based hardeners and the like.

The amount of hardener contained with respect to the entire amount of adhesive composition is preferably equal to or less than 2% by mass. This is because, in this way, the hardener that is not cured is unlikely to be left and the adhesion to the material to be adhered is satisfactory.

<Curing Accelerator>

A curing accelerator can also be mixed with the adhesive composition. Examples of the curing accelerator include imidazoles such as 2-phenyl-4,5-dihydroxymethylimidazole, 2-phenyl-4-methyl-5-hydroxymethylimidazole, 2-methyl-4-methylimidazole and 1-cyano-2-ethyl-4-methylimidazole, tertiary amines, triphenylphosphines, urea-based compounds, phenols, alcohols, carboxylic acids and the like. Only one type of curing accelerator may be used or two or more types thereof may be used together.

Although the amount of curing accelerator mixed is not limited and may be determined as necessary, when the curing accelerator is used, the amount of curing accelerator mixed with respect to the entire amount of adhesive composition is generally equal to or less than 0.01% to 0.5% by mass.

<Solvent>

The adhesive composition may further include a solvent in order to adjust the adhesive composition into a paste state. When the solvent is included, the solvent that does not dissolve the particles of the thermoplastic resin is used so that the shape of the particles of the thermoplastic resin is maintained in the paste. Although there is no particular limitation to the other points, since the solvent is easily volatilized at the time of curing of the adhesive composition, the solvent whose boiling point is equal to or less than 350° C. is preferable, and the solvent whose boiling point is equal to or less than 300° C. is more preferable. Specific examples thereof include acetate, ether, hydrocarbon and the like. More specifically, dibutyl carbitol, butyl carbitol acetate or the like is preferably used.

When the solvent is used, a content of the solvent with respect to the adhesive composition is preferably equal to or greater than 1% by mass and equal to or less than 15% by mass. In terms of workability, the content is more preferably equal to or less than 10% by mass.

In addition to the components described above, an antioxidant, a UV absorber, a tackifier, a viscosity modifier, a dispersant, a coupling agent, a toughness enhancer, an elastomer and the like can be mixed, as necessary, with the adhesive composition as long as the effects of the present disclosure are not inhibited.

The adhesive composition of this embodiment can be obtained by mixing and stirring, in an arbitrary order, the metal fine particles (metal filler), the binder resin, the particles of the thermoplastic resin and the other components. As a dispersing method, for example, the method of two rolls, three rolls, a sand mill, a roll mill, a ball mill, a colloid mill, a jet mill, a bead mill, a kneader, a homogenizer, a propeller-less mixer or the like can be adopted.

The metal layer 60 of this embodiment is formed of the adhesive composition described above, the adhesive composition is heated to be cured and thus the metal layer 60 serving as the cured adhesive can be obtained. Although a method for curing the adhesive composition is not particularly limited, for example, the adhesive composition is subjected to heat treatment at 150 to 300° C. for 0.5 to 3 hours, and thus the metal layer 60 serving as the cured adhesive can be obtained.

When the members to be joined are joined together with the adhesive composition, the adhesive composition is normally cured by heating to perform the joining. Although the heating temperature at that time is not particularly limited, in order to form a close state where point contact is made between the metal fine particles (metal filler) and the member to be joined and the metal fine particles (metal filler) so as to stabilize the shape of the adhesion portion, the heating temperature is preferably equal to or greater than 150° C., more preferably equal to or greater than 180° C. and further preferably equal to or greater than 200° C.

In order to prevent the occurrence of a phenomenon in which bonding between the metal fine particles (metal filler) excessively proceeds to cause necking in the metal filler and in which thus the member to be joined and the metal fine particles are securely bonded to be brought into an excessively hard state, the heating temperature is preferably equal to or less than 300° C., more preferably equal to or less than 275° C. and further preferably equal to or less than 250° C.

FIG. 6 is evaluation results obtained by evaluating the properties of a joint part (metal layer) joined with the adhesive composition of this embodiment.

In the property evaluation method of the metal layer (joint part), a state is evaluated where when the adhesive composition is used to join the member to be joined, even if repeated temperature changes are received, the separation of the member to be joined and the metal layer (cured adhesive) 60 and the breakage of the metal layer (cured adhesive) 60 are unlikely to occur.

As the property evaluation method of the joint part, various methods are mentioned. This embodiment illustrates, as the property evaluation method, a case where a cooling/heating cycle test is performed under conditions described later, where a ratio of a separation (including a breakage) area after the test is measured where thus the evaluation is performed.

The ratio of the separation area measured by the method described above is preferably equal to or less than 15%, more preferably equal to or less than 10% and further preferably equal to or less than 5%.

The adhesive composition was applied to a silver-plated copper substrate of 12 mm×12 mm, a silicon chip of 5 mm×5 mm subjected to silver spattering was placed on the application surface and thereafter heating was performed under an atmosphere of nitrogen at 250° C. for 60 minutes, with the result that a metal joint member (hereinafter also simply referred to as the "metal joint member") in which two members to be adhered were joined with the cured adhesive (joint portion) was produced.

The cooling/heating cycle test was performed with the metal joint member, and the separation area was measured. In this test, an operation of holding the substrate at −50° C. for 30 minutes and thereafter holding it at 150° C. for 30 minutes was set to one cycle, 2000 cycles were repeated and the ratio of the separation area of the silicon chip after the test was measured. The results are shown in FIG. 6.

For the ratio of the separation area, an image in a separated state after 2000 cycles was obtained with an ultrasound image/inspection device "Fine SAT FS300III" (product name) under conditions of a probe of 140 MHz, a measurement area of X 12 mm and Y 12 mm, a measurement pitch of X 0.025 mm and Y 0.025 mm, a gain of 35.0 dB, an S gate delay of 9.4 us, a width of 0.945 us, a trigger of 30%, an F gate delay of 0.076 us, a width of 0.035 us and a trigger of 15%. In the obtained image, binarization software "image J ver. 1" was used to image-convert light and shade into two gradations of white and black, and the ratio of the separation area was determined by relational formula (1) below. As the detailed procedure for the "image J ver. 1", the joint portion was cut out from the SAT image, the type was set to 8 bits of white and black, "inversion of color" was selected, thereafter "automatic" was applied as "Default" to a threshold value setting and thus a binarized image was obtained.

$$\text{Ratio of separation area(\%)} = \text{separation area(number of black pixels)/chip area(number of black pixels+number of white pixels)} \times 100 \qquad (1)$$

As shown in FIG. 6, in Examples 1 to 6, it was confirmed that satisfactory results in which the separation areas were 2 to 10% were obtained, and that even when repeated temperature changes were received, the separation of the member to be joined and the breakage of the joint portion were unlikely to occur.

By a vertical cross section observation (SEM analysis) on the joining surface of the joint portion, an area occupied by a metal component and an area occupied by organic component parts and/or voids were individually calculated. With "SEM JSM6010LA", a cross-sectional image was obtained under detailed observation conditions of an acceleration voltage of 20 kV, a spot size of 40, a WD of 11 mm, a high vacuum mode, a secondary electron image and a magnification of 2000. In the cross-sectional observation, for images of any five parts of a cross section obtained from the SEM, the binarization software "image J ver. 1" was used, 20 μm square regions were individually cut out, the type was set to 8 bits of white and black, "inversion of color" was selected, thereafter "automatic" was applied as "Default" to a threshold value setting and thus a binarized image was obtained. The area occupied by the metal component was determined by relational formula (2) below, and area percent was calculated from the average value thereof.

$$\text{Area ratio occupied by metal component(\%)} = \text{area occupied by metal component(number of black pixels)/area of selected region(number of black pixels+number of white pixels)} \times 100 \qquad (2)$$

(A-2-2) Method for Joining Member to be Joined

Figure 7:
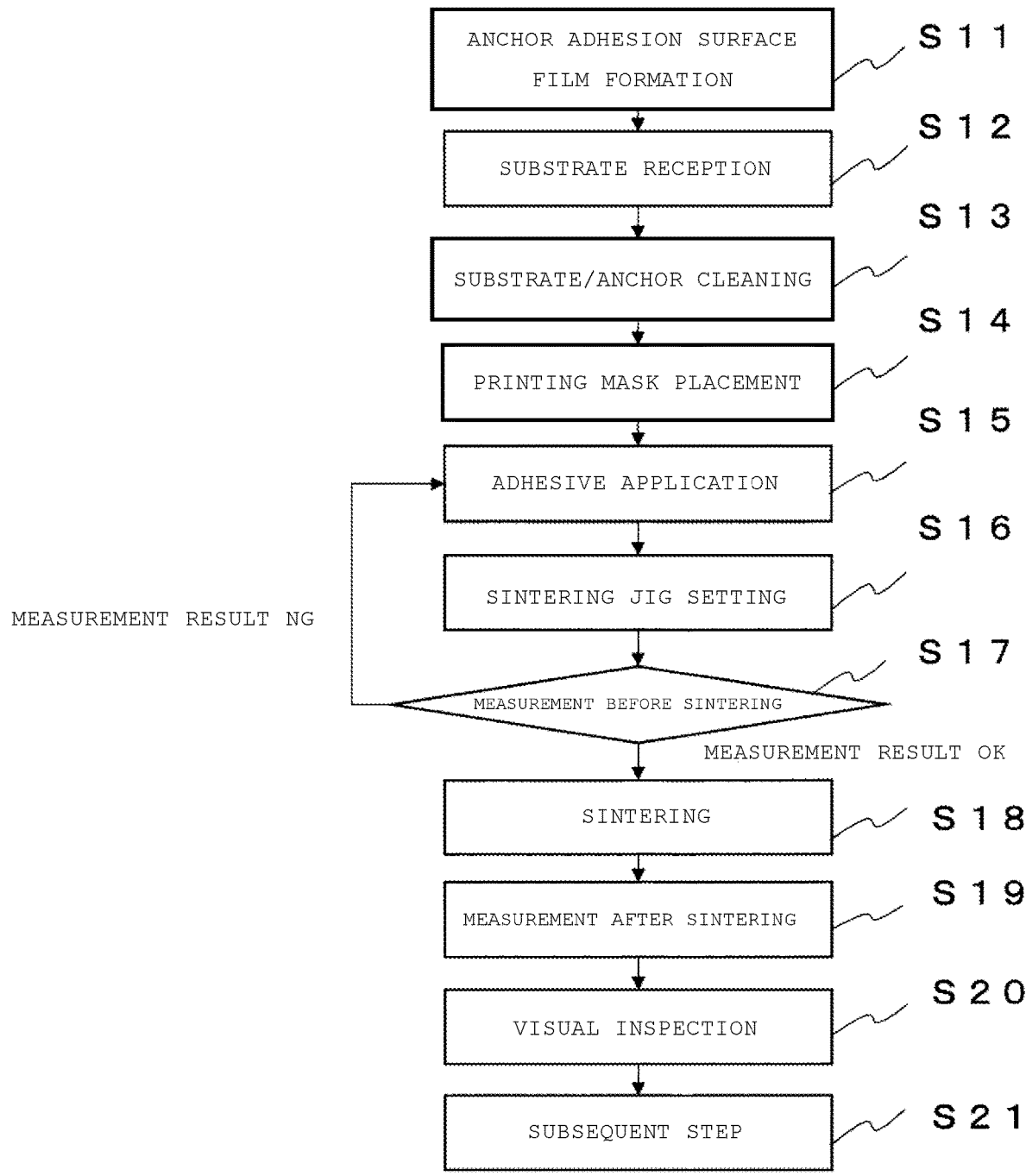
FIG. 7 is a flowchart showing a method for joining the anchors of the embodiment to the upper surface of the probe substrate.
Figure 8:
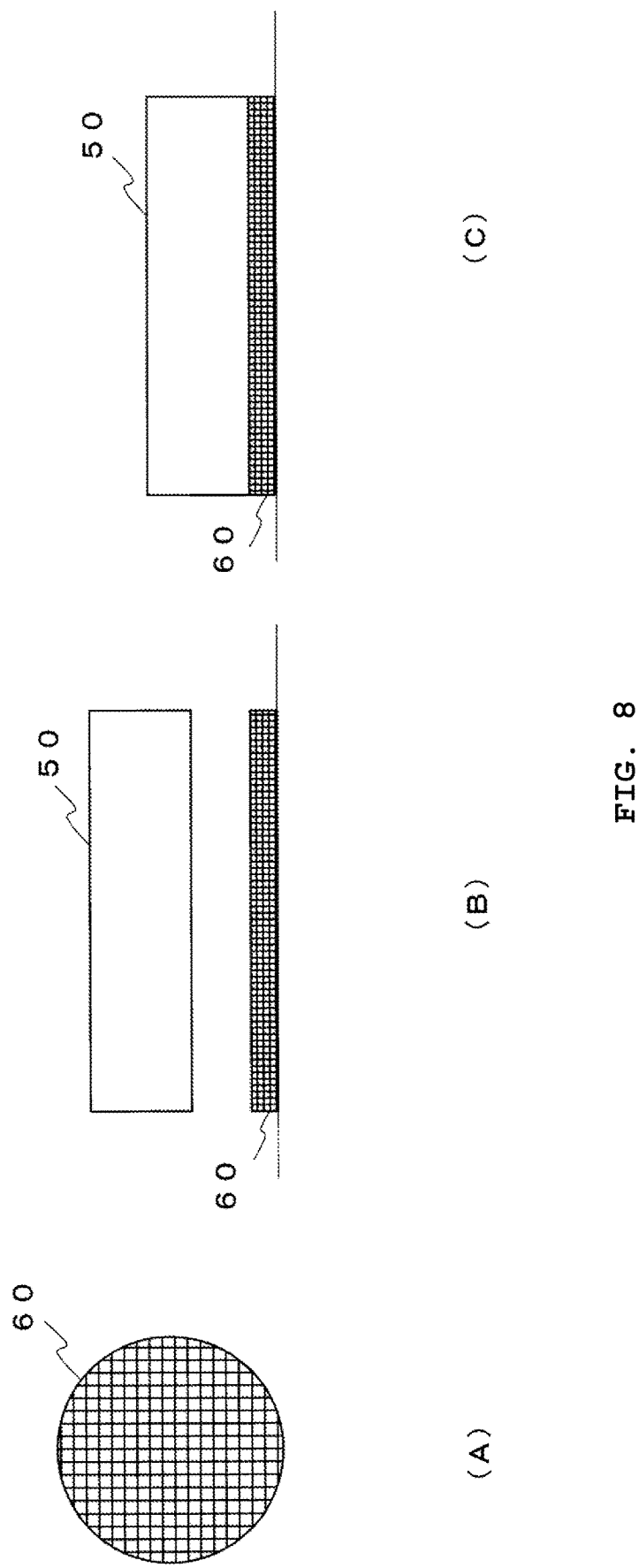
FIG. 8 is an illustrative diagram illustrating the method for joining the anchors of the embodiment.

FIG. 7 is a flowchart showing a method for joining the anchors 50 of this embodiment to the upper surface of the probe substrate 16, and FIG. 8 is an illustrative diagram illustrating the method for joining the anchors 50.

Figure 9:
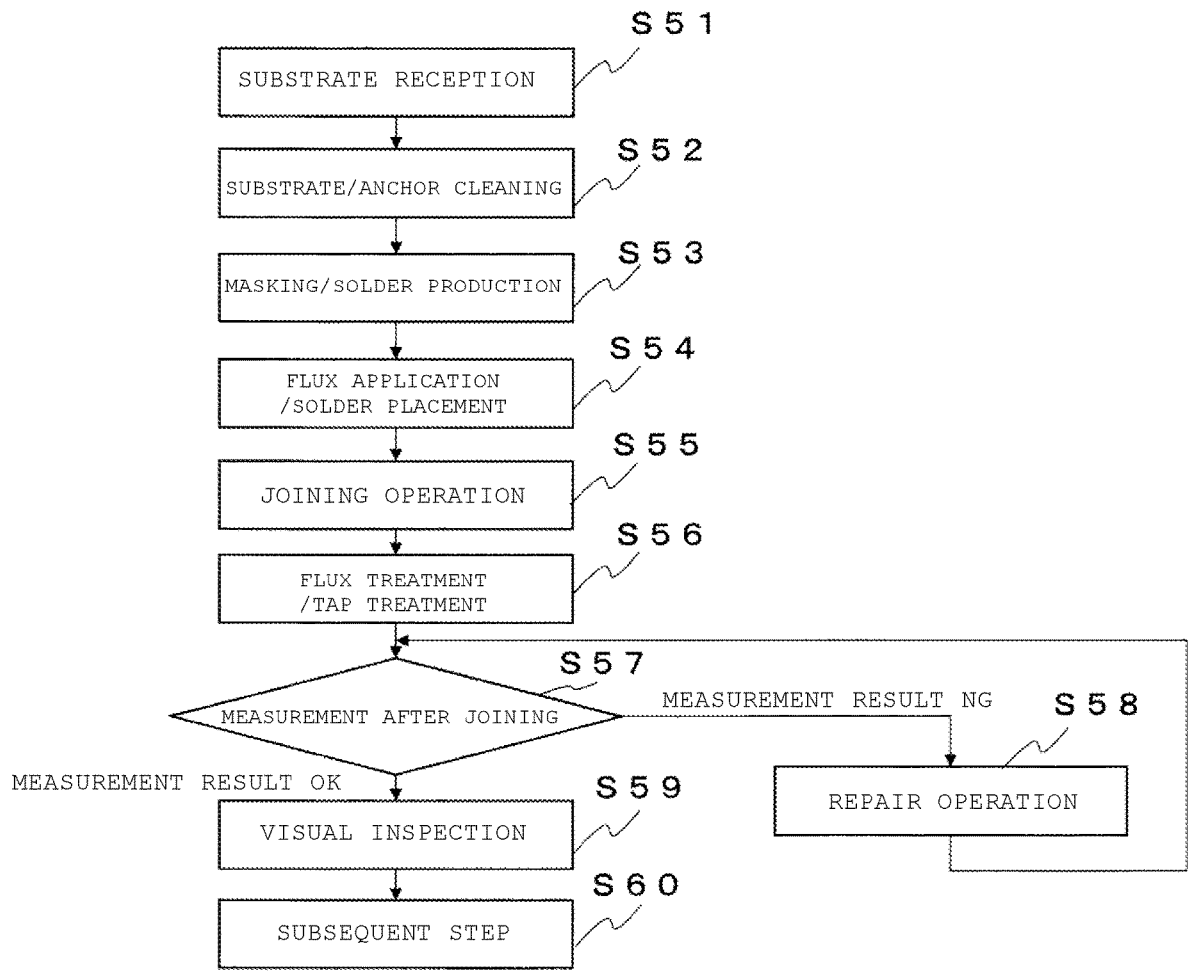
FIG. 9 is a flowchart showing a conventional method for joining the anchors to the upper surface of the probe substrate with a solder material.
Figure 10:
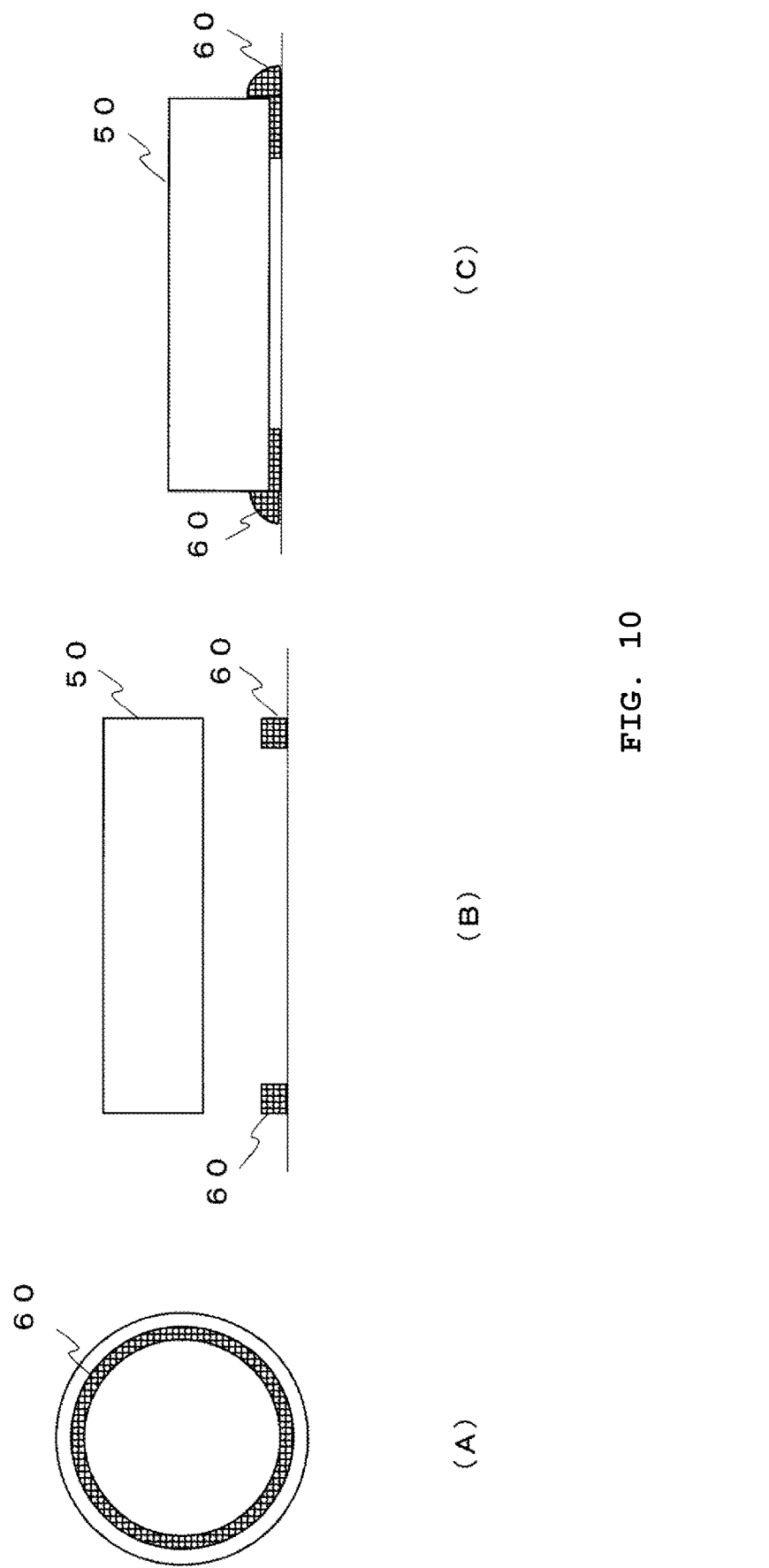
FIG. 10 is an illustrative diagram illustrating the conventional method for joining the anchors with the solder material.

FIG. 9 is a flowchart showing a method for joining the anchors 50 to the upper surface of the probe substrate with a solder material, FIG. 10 is an illustrative diagram illustrating the method for joining the anchors 50 with the solder material and the method for joining the anchors 50 in this embodiment will be described in comparison with the conventional method for joining the anchors 50 with the solder material.

The conventional method for joining the anchors 50 with the solder material will first be described briefly. As shown in FIG. 9, in the conventional method for joining the anchors 50, the probe substrate 16 is received from an unillustrated preceding step (step S51), and treatment for joining the anchors 50 to the upper surface of the probe substrate 16 is started.

The surface of the received probe substrate 16 and the anchors 50 are cleaned (step S52), and parts of the upper surface of the probe substrate 16 that are not related to the joining of the anchors 50 are masked and the solder material is produced (step S53). Then, when on the upper surface of the probe substrate 16, a flux (soldering accelerator) is applied to place the solder material (step S54), for example, with a soldering automatic machine or the like, an operation of joining the anchors 50 is performed (step S55), and flux treatment and tap treatment are performed (step S56).

Here, in the conventional method for joining the anchors 50, an operator performs an operation of joining the anchors 50 to the upper surface of the probe substrate 16 one by one. Hence, the operator repeatedly performs the treatment in steps S51 to S56 according to the number of anchors 50 provided on the upper surface of the probe substrate 16, and when the operation of joining all the anchors 50 is completed, post-joining measurement processing is performed (step S57). In this processing, the measurement of heights of all the anchors 50 provided on the upper surface of the probe substrate 16, the measurement of the inclination of all the anchors 50 and the like are performed.

When the result of the measurement after the joining is not satisfactory, a repair operation is performed on the joining of the anchors 50 to be repaired (step S58), and the measurement processing after the joining is performed again. When the result of the measurement is satisfactory, a predetermined visual inspection is performed (step S59), and the probe substrate 16 to which the anchors 50 are joined is passed to the subsequent step (step S60).

By contrast, the method for joining the anchors 50 in this embodiment will be as follows.

In FIG. 7, film formation treatment is performed with a metal on surfaces to which the anchors 50 are adhered (step S11). As described above, the film formation is performed on the contact surfaces of the anchors 50, and thus after burning, the property of joining the anchors 50 and the metal layers 60 serving as the cured adhesive can be satisfactory, with the result that the separation of the anchors 50 and the metal layers (cured adhesive) 60 and the like are unlikely to occur.

Here, the metal that is formed as the film on the surfaces to which the anchors 50 are adhered can be, for example, the same metal as the metal fine particles contained in the adhesive composition or a metal which is not the same type of metal but which can be used as the metal fine particles. When the anchors 50 are formed of an applicable metal, the film formation treatment on the surfaces to which the anchors 50 are adhered may be omitted. The metal film formation treatment on the surfaces to which the anchors 50 are adhered can be previously performed.

Then, when the probe substrate 16 is received from the preceding step (step S12), the surface of the probe substrate 16 and the anchors 50 are cleaned (step S13), and parts of the upper surface of the probe substrate 16 that are not related to the joining of the anchors 50 are subjected to print masking (step S14).

On the upper surface of the probe substrate 16, the adhesive composition is applied to the positions in which the anchors 50 are arranged so as to form the layers of the adhesive composition (step S15).

Here, as shown in FIGS. 10(A) and 10(B), when the anchor 50 is joined with the solder material, on the upper surface of the probe substrate 16, the anchor 50 is joined such that the solder material is present on an outer edge portion within the contact surface on which the anchor 50 is provided. In this way, when the joining is performed with the solder material, as shown in FIG. 10(C), the solder material is provided to slightly cover the bottom surface and the side surface of the anchor 50, and thus the joining strength is enhanced.

By contrast, in this embodiment, as shown in FIG. 8(A), on the upper surface of the probe substrate 16, the adhesive composition is applied to the entire contact surface on which the anchor 50 is provided. In this way, as shown in FIGS. 8(B) and 8(C), in a state where the layer of the adhesive composition is provided on the entire bottom surface of the anchor 50, the anchor 50 is provided on the upper surface of the probe substrate 16. Although in this embodiment, a case where the adhesive composition is applied to the region of the position of the anchor 50 on the upper surface of the probe substrate 16 is illustrated, the adhesive composition may be applied to the bottom surface of the anchor 50. In any case, the adhesive composition is present between the probe substrate 16 and the anchor 50 serving as the member to be joined.

The thickness of the metal layer applied to the upper surface of the probe substrate 16 can be so thick as to be, for example, about 10 to 75 μm.

A sintering jig for simultaneously placing a plurality of anchors 50 on the upper surface of the probe substrate 16 is set (step S16), and thus a plurality of the anchors 50 are simultaneously placed on the upper surface of the probe substrate 16.

Conventionally, when the anchors 50 are joined with the solder material, a plurality of the anchors 50 are placed one by one, and thus the joining is performed whereas in this embodiment, the dedicated sintering jig is set on the upper surface of the probe substrate 16, and thus the anchors 50 can be set simultaneously. As the sintering jig, for example, a sintering jig can be used which holds the anchors 50 in positions corresponding to the positions of the anchors 50 provided on the upper surface of the probe substrate 16 and in which when the anchors 50 are set, the sintering jig is pressed toward the upper surface of the probe substrate 16 so as to move the anchors 50 held by the sintering jig to the upper surface of the probe substrate 16. In this way, it is possible to simultaneously set the anchors 50 on the upper surface of the probe substrate 16.

Thereafter, measurement processing before the sintering is performed (step S17). In this processing, as in the conventional measurement processing described above, the measurement of heights of all the anchors 50 provided on the upper surface of the probe substrate 16, the measurement of the inclination of all the anchors 50 and the like can be performed.

When the result of the measurement before the sintering is not satisfactory, all the anchors 50 provided on the upper surface of the probe substrate 16 and all the layers of the adhesive composition are removed, and then the treatment in steps S15 to S17 is repeatedly performed again. When the result of the measurement before the sintering is satisfactory, the probe substrate 16 in a state where a plurality of the anchors 50 are placed is sintered (step S18). By the sintering described above, the adhesive composition is cured, the metal layers 60 serving as the cured adhesive can be obtained and thus the anchors 50 and the metal layers 60 are securely joined.

Measurement processing after the sintering is performed (step S19), a predetermined visual inspection is performed (step S20) and the probe substrate 16 to which the anchors 50 are joined is passed to the subsequent step (step S21).

[Durability Measurements of Joint Portions Under Environments of Temperature Changes]

Figure 11:
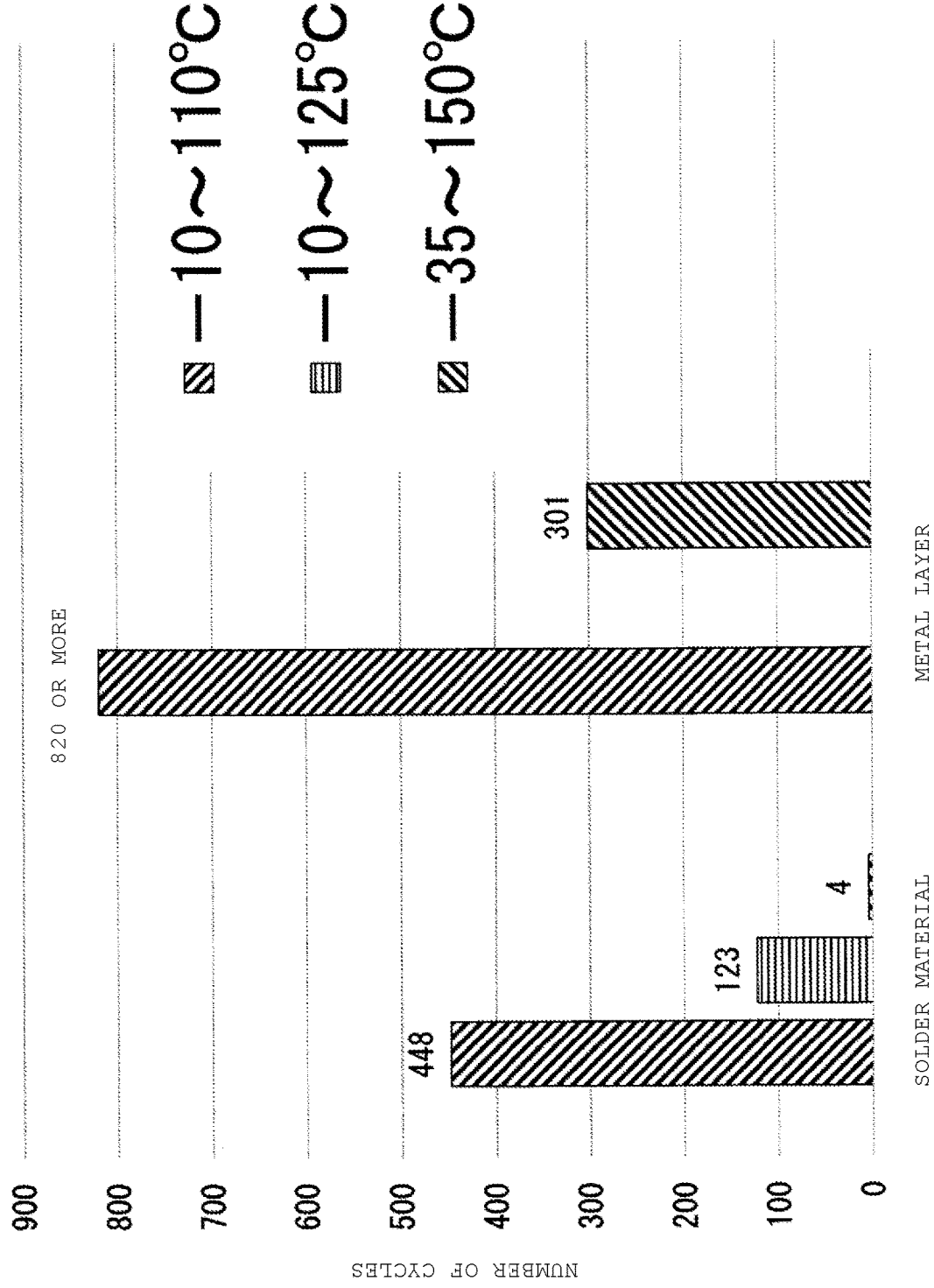
FIG. 11 is a diagram showing the results of cycle measurements indicating the durability of joint portions under environments of temperature changes in the embodiment.

FIG. 11 is a diagram showing the results of cycle measurements indicating the durability of the joint portions under environments of temperature changes.

Here, the cycle measurements for measuring the durability of the joint portions under environments of temperature changes in the probe substrate 16 to which the anchors 50 were joined with the metal layers 60 of this embodiment and in the probe substrate 16 to which the anchors 50 were joined with the solder material were performed.

Specifically, the durability of the joint portions was measured when in the environment of each of three temperature change ranges of "−10 to 110° C.", "−10 to 125° C." and "−35 to 150° C.", nine anchors 50 were joined to the upper surface of the probe substrate 16 and a load of 40 kgf was applied to each of the anchors 50. Among the nine anchors 50, the joint portions of five anchors 50 that were arbitrarily selected were used as samples.

More specifically, for example, in the case of "−10 to 110° C.", the temperature was changed from the lower limit temperature of "−10° C.", to a steady temperature of "22° C." and then to the upper limit temperature of "110° C." in this order, this temperature change was set to one cycle, the load was continuously applied to the anchors 50 for 40 minutes at each of the temperatures and measurements were made as to how many cycles the joint portions withstood. Even in the cases of the other temperature changes, measurements were made under the same conditions.

As shown in FIG. 11, when the anchors 50 were joined to the probe substrate 16 with the solder material, the durability of the joint portions was 448 cycles in the environment of "−10 to 110° C.", was 123 cycles in the environment of "−10 to 125° C." and was 4 cycles in the environment of "−35 to 150° C.".

By contrast, when the anchors 50 were joined to the probe substrate 16 with the metal layers (cured adhesive) 60, the durability of the joint portions was 820 cycles or more in the environment of "−10 to 110° C." and was 301 cycles in the environment of "−35 to 150° C.". Hence, it is found that as compared with the case where the solder material was used, the durability of the joint portions was enhanced and that the life of the joint portions was prolonged.

(A-2-3) Joining of Probe

Although in the above description, the case where the member to be joined is the anchor 50 is illustrated, and the case where the metal layer 60 is applied to the upper surface of the probe substrate 16 and where heat is applied to join the anchor 50 is illustrated, the member to be joined is not limited to the anchor 50. In the following description, a case where the member to be joined is the probe 20 will be illustrated.

Figure 12:
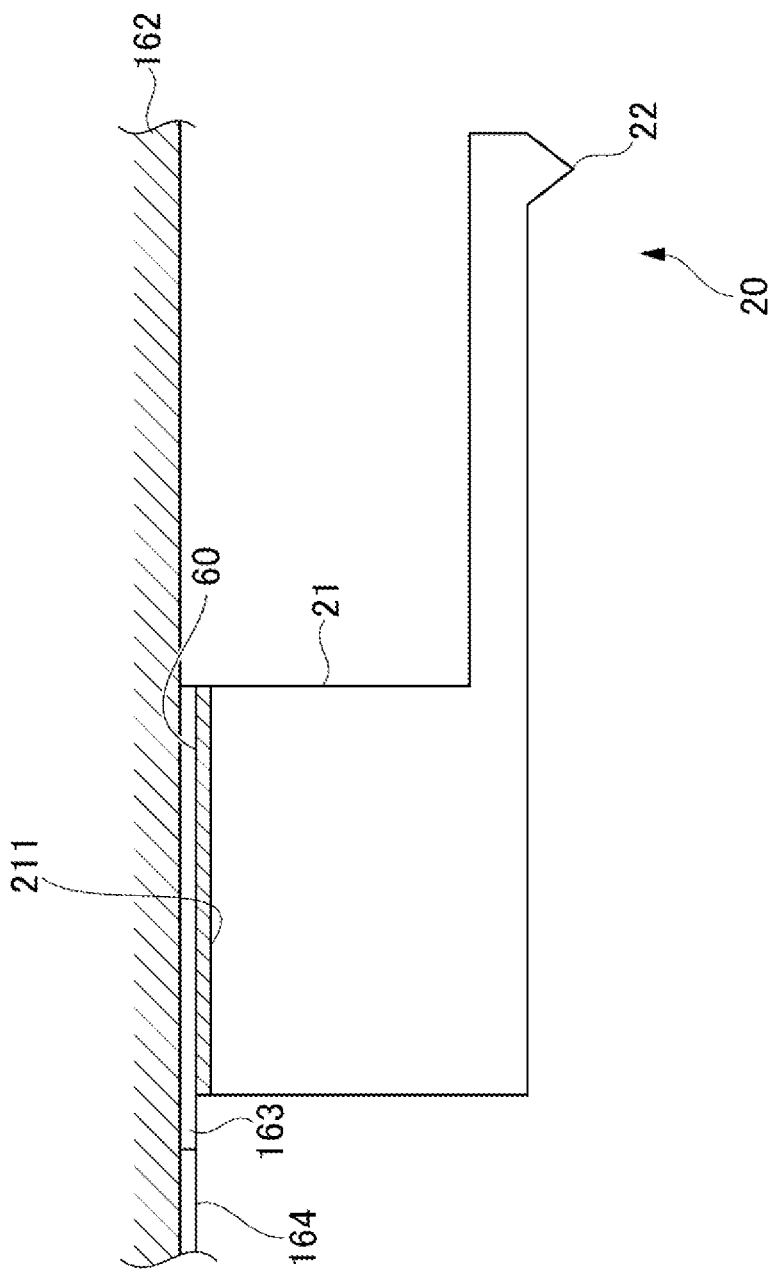
FIG. 12 is a configuration diagram showing the configurations of a probe land formed on the lower surface of the probe substrate according to the embodiment and the probe connected thereto.

FIG. 12 is a configuration diagram showing the configurations of the probe land formed on the lower surface of the probe substrate 16 according to this embodiment and the probe connected thereto.

As shown in FIG. 12, a wiring pattern 164 is formed on the lower surface of the probe substrate 16 (that is, the lower surface of the multilayer wiring substrate 162), and the probe land (connection terminal) 163 connected to the wiring pattern 164 is provided.

The probe 20 is provided to connect to the probe land 163 provided on the lower surface of the multilayer wiring substrate 162. The probe 20 is, for example, a cantilever-type electrical contactor, an upper bottom portion 211 on the side of a base end portion 21 of the probe 20 is joined to the plate-shaped probe land 163 so as to fix the probe 20 and a tip portion 22 of the probe 20 is brought into electrical contact with the electrode terminal 2a of the member to be inspected 2.

Conventionally, when the probe 20 is joined to the probe land 163 provided on the lower surface of the multilayer wiring substrate 162, the probe 20 is joined to the probe land 163 with the solder material.

However, when the tip portion 22 of the probe 20 is brought into contact with the electrode terminal 2a of the member to be inspected 2, a high contact load acts, and the durability of the solder material is not sufficient. Disadvantageously, in an environment of temperature changes (in particular, in a high temperature environment), the solder material is softened, and thus joining strength between the probe land 163 and the probe 20 is not sufficient.

Hence, when the probe 20 is joined to the probe land 163 provided on the lower surface of the probe substrate 16 (the multilayer wiring substrate 162), the metal layer 60 is applied to the probe land 163, the probe 20 is provided and then heat is applied, with the result that the probe land 163 and the probe 20 can be securely joined together.

(A-4) Effects of Embodiment

As described above, in this embodiment, when the member to be joined such as the anchor or the probe is joined to one or each of the upper surface (first surface) and the lower surface (second surface) of the probe substrate, the metal layer formed of the adhesive composition containing at least the metal fine particles and the particles of the thermoplastic resin is applied to the adhesion surface of the probe substrate, heating is performed and thus the member to be joined can be securely joined to the probe substrate. Consequently, for a high load, the durability of the joint portion between the probe substrate and the member to be joined is enhanced, and thus the life thereof can be prolonged.

(B) Other Embodiments

Although various variations are mentioned even in the embodiment described above, the present disclosure can also be applied to variations below.

(B-1) When in the embodiment described above, the properties of the metal layer 60 described above are utilized to join the anchor 50 to the upper surface of the probe substrate 16, the case where the probe 20 is joined to the lower surface of the probe substrate 16 is illustrated. However, by the properties of the metal layer 60 described above, the metal layer 60 is applied between the substrate member (ceramic substrate) 161 and the multilayer wiring substrate 162 of the probe substrate 16, and heating is performed, with the result that the substrate member 161 and the multilayer wiring substrate 162 may be joined together. In the multilayer wiring substrate in which a plurality of substrates are joined together, the metal layer 60 is applied between the substrates, and heating is performed, with the result that the substrates may be joined together.

Figure 13:
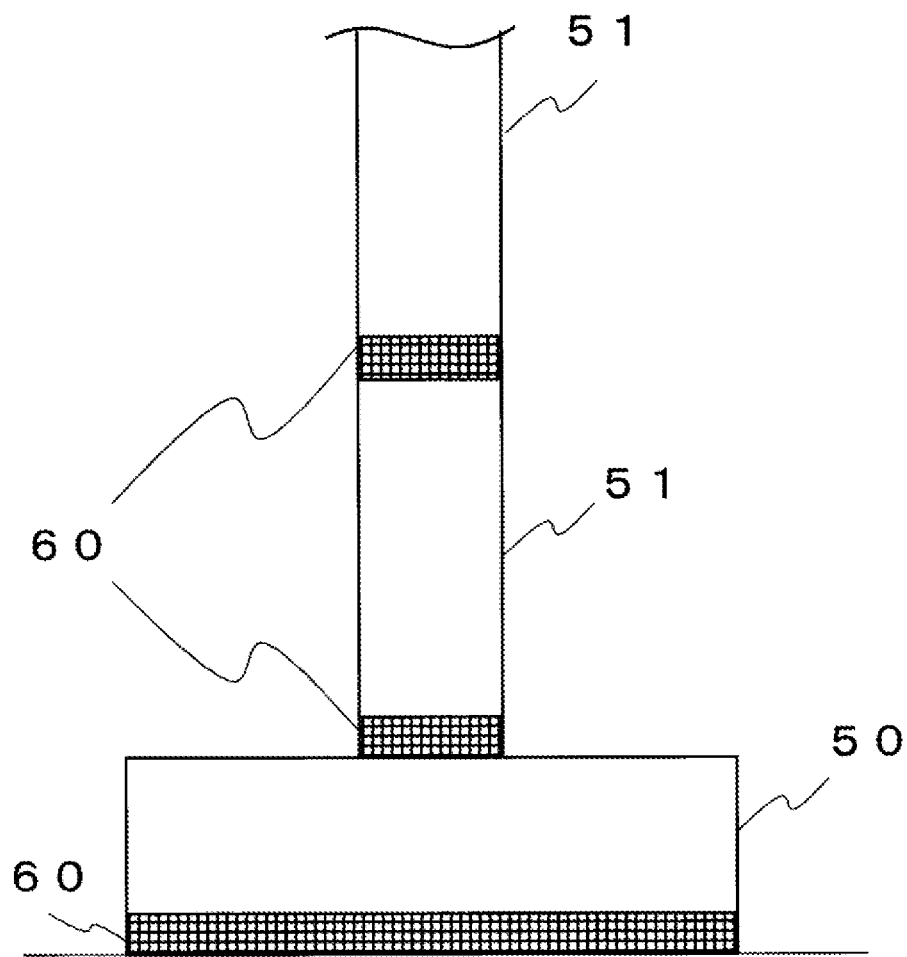
FIG. 13 is a configuration diagram showing the configurations of an anchor of a multi-stage structure and a support portion in a variation.

(B-2) When in the embodiment described above, the metal layer 60 is used to join the anchor 50 to the upper surface of the probe substrate 16, as shown in FIG. 13, a multi-stage structure using a plurality of support portions (spacers) 51 may be adopted in order to fix the probe substrate 16 and the support member 12. In such a case, as shown in FIG. 13, the metal layer 60 is applied between the anchor 50 and the support portion (spacer) 51, the metal layer 60 is further applied between the support portions (spacers) 51 to be bonded together and heating is performed, with the result that the joining of the anchor 50 and the support portion (spacer) 51 and the joining of the support portions (spacers) 51 may be securely performed. Naturally, when as shown in FIG. 1, the one-stage horizontal holding member is used, the metal layer 60 may be used between the anchor 50 and the support portion (spacer) 51 so as to join them.

REFERENCE SIGNS LIST

10: electrical connecting apparatus, 12: support member, 121: through hole, 14: wiring substrate, 14a: connection terminal, 141: through hole, 15: electrical connection unit, 151: flange portion, 16: probe substrate, 161: substrate member (ceramic substrate), 162: multilayer wiring substrate, 163: probe land (connection terminal), 164: wiring pattern, 18: probe substrate support member, 20: probe (electrical contactor), 21: base end portion, 211: upper bottom portion, 22: tip portion, 50: anchor, 501: female screw portion, 51: support portion (spacer), 60: metal layer, 61: metal, 62: void or organic component part, 2: member to be inspected, 2a: electrode terminal, 3: chuck top

The invention claimed is:

1. A probe substrate comprising:
a plurality of electrical contactors respectively brought into electrical contact with a plurality of electrode terminals of a member to be inspected,
wherein a joint portion for a member to be joined is provided on one or each of a first surface and a second surface of the probe substrate and the member to be joined is joined to the joint portion with a metal layer that includes, in a metal component, at least 70 atomic percent or more of a transition metal and that is formed by sintering, and/or in a joining surface between a plurality of substrates of the probe substrate, the substrates are joined together with the metal layer formed by sintering,
in the metal layer formed by sintering, a plurality of organic component parts and/or voids formed by heating an adhesive composition including a thermoplastic resin are left and
a plurality of the organic component parts and/or the voids included in the metal layer formed by sintering have 5 to 80 area percent in a vertical cross section of the metal layer formed by sintering.

2. The probe substrate according to claim 1, comprising:
a plurality of anchor members arranged on the first surface of the probe substrate; and
a plurality of support members respectively arranged on a plurality of the anchor members,
wherein the member to be joined is each of the anchor members, and each of the anchor members is joined, with the metal layer formed by sintering, to a joining position of each of the anchor member on the first surface of the probe substrate.

3. The probe substrate according to claim 2,
wherein the electrical contactors are arranged on a plurality of connection terminals formed on the second surface of the probe substrate, and
the member to be joined is each of the electrical contactors, and each of the electrical contactors is joined, with the metal layers formed by sintering, to a plurality of the connection terminals on the second surface of the probe substrate.

4. The probe substrate according to claim 3,
wherein the transition metal included in the metal layer formed by sintering is a Group 11 metal.

5. The probe substrate according to claim 4,
wherein the transition metal included in the metal layer formed by sintering includes silver as a main component.

6. An electrical connecting apparatus electrically connecting an inspection device and a plurality of electrode terminals of a member to be inspected, the electrical connecting apparatus comprising:
a wiring substrate including a wiring circuit connected to the inspection device;
the probe substrate according to claim 3; and
a connection unit connecting the wiring circuit of the wiring substrate and a plurality of the electrical contactors of the probe substrate respectively.

7. The probe substrate according to claim 2,
wherein the transition metal included in the metal layer formed by sintering is a Group 11 metal.

8. The probe substrate according to claim 7,
wherein the transition metal included in the metal layer formed by sintering includes silver as a main component.

9. An electrical connecting apparatus electrically connecting an inspection device and a plurality of electrode terminals of a member to be inspected, the electrical connecting apparatus comprising:
a wiring substrate including a wiring circuit connected to the inspection device;
the probe substrate according to claim 2; and
a connection unit connecting the wiring circuit of the wiring substrate and a plurality of the electrical contactors of the probe substrate respectively.

10. An electrical connecting apparatus electrically connecting an inspection device and a plurality of electrode terminals of a member to be inspected, the electrical connecting apparatus comprising:
a wiring substrate including a wiring circuit connected to the inspection device;
the probe substrate according to claim 7; and
a connection unit connecting the wiring circuit of the wiring substrate and a plurality of the electrical contactors of the probe substrate respectively.

11. The probe substrate according to claim 1,
wherein the electrical contactors are arranged on a plurality of connection terminals formed on the second surface of the probe substrate, and
the member to be joined is each of the electrical contactors, and each of the electrical contactors is joined, with the metal layers formed by sintering, to a plurality of the connection terminals on the second surface of the probe substrate.

12. The probe substrate according to claim 11,
wherein the transition metal included in the metal layer formed by sintering is a Group 11 metal.

13. The probe substrate according to claim 12,
wherein the transition metal included in the metal layer formed by sintering includes silver as a main component.

14. An electrical connecting apparatus electrically connecting an inspection device and a plurality of electrode terminals of a member to be inspected, the electrical connecting apparatus comprising:
a wiring substrate including a wiring circuit connected to the inspection device;
the probe substrate according to claim 11; and
a connection unit connecting the wiring circuit of the wiring substrate and a plurality of the electrical contactors of the probe substrate respectively.

15. The probe substrate according to claim 1,
wherein the transition metal included in the metal layer formed by sintering is a Group 11 metal.

16. The probe substrate according to claim 15,
wherein the transition metal included in the metal layer formed by sintering includes silver as a main component.

17. The probe substrate according to claim 1,
wherein a plurality of the organic component parts and/or the voids included in the metal layer formed by sintering are formed by heating the adhesive composition including the thermoplastic resin having an average particle diameter of 1 to 12 μm.

18. The probe substrate according to claim 1,
wherein a thickness of the metal layer formed by sintering is 20 to 75 μm.

19. An electrical connecting apparatus electrically connecting an inspection device and a plurality of electrode terminals of a member to be inspected, the electrical connecting apparatus comprising:
a wiring substrate including a wiring circuit connected to the inspection device;
the probe substrate according to claim 1; and
a connection unit connecting the wiring circuit of the wiring substrate and a plurality of the electrical contactors of the probe substrate respectively.

\* \* \* \* \*